United States Patent
Im et al.

(10) Patent No.: US 10,868,016 B2
(45) Date of Patent: Dec. 15, 2020

(54) SEMICONDUCTOR MEMORY DEVICE AND METHOD OF FABRICATING THE SAME

(71) Applicant: SAMSUNG ELECTRONICS CO., LTD., Suwon-si (KR)

(72) Inventors: Dong-Hyun Im, Suwon-si (KR); Daehyun Kim, Suwon-si (KR); Hoon Park, Hwaseong-si (KR); Jae-Hong Seo, Hwaseong-si (KR); Chunhyung Chung, Seoul (KR); Jae-Joong Choi, Suwon-si (KR)

(73) Assignee: SAMSUNG ELECTRONICS., LTD., Suwon-si (KR)

( * ) Notice: Subject to any disclaimer, the term of this patent is extended or adjusted under 35 U.S.C. 154(b) by 0 days.

(21) Appl. No.: 16/458,292

(22) Filed: Jul. 1, 2019

(65) Prior Publication Data

US 2019/0393225 A1   Dec. 26, 2019

Related U.S. Application Data

(63) Continuation-in-part of application No. 16/050,848, filed on Jul. 31, 2018, now Pat. No. 10,373,959.

(30) Foreign Application Priority Data

Sep. 18, 2017   (KR) .......................... 10-2017-0119715

(51) Int. Cl.
*H01L 27/105* (2006.01)
*H01L 27/108* (2006.01)
(Continued)

(52) U.S. Cl.
CPC ...... *H01L 27/10823* (2013.01); *H01L 21/283* (2013.01); *H01L 21/28079* (2013.01);
(Continued)

(58) Field of Classification Search
CPC ......... H01L 21/28026; H01L 21/82345; H01L 29/4236
See application file for complete search history.

(56) References Cited

U.S. PATENT DOCUMENTS

| | | |
|---|---|---|
| 5,654,242 A | 8/1997 | Komatsu |
| 8,865,594 B2 | 10/2014 | Lee et al. |

(Continued)

OTHER PUBLICATIONS

S.K. Gautam, et al., "Reduction of GIOL Using Dual Work-Function Metal Gate in DRAM," 2016 IEEE 8th International Memory Workshop (IMW), Jun. 23, 2016, pp. 1-4.

(Continued)

*Primary Examiner* — George R Fourson, III
(74) *Attorney, Agent, or Firm* — F. Chau & Associates, LLC

(57) ABSTRACT

A method of fabricating a semiconductor memory device includes etching a substrate that forms a trench that crosses active regions of the substrate, forming a gate insulating layer on bottom and side surfaces of the trench, forming a first gate electrode on the gate insulating layer that fills a lower portion of the trench, oxidizing a top surface of the first gate electrode where a preliminary barrier layer is formed, nitrifying the preliminary barrier layer where a barrier layer is formed, and forming a second gate electrode on the barrier layer that fills an upper portion of the trench.

20 Claims, 21 Drawing Sheets

(51) Int. Cl.
*H01L 21/283* (2006.01)
*H01L 29/423* (2006.01)
*H01L 21/28* (2006.01)
*H01L 29/66* (2006.01)
*H01L 29/49* (2006.01)
*H01L 29/51* (2006.01)
*H01L 21/8234* (2006.01)

(52) U.S. Cl.
CPC .. *H01L 27/10814* (2013.01); *H01L 27/10876* (2013.01); *H01L 29/4236* (2013.01); *H01L 29/42376* (2013.01); *H01L 29/4958* (2013.01); *H01L 29/4966* (2013.01); *H01L 29/4983* (2013.01); *H01L 29/518* (2013.01); *H01L 29/66621* (2013.01); *H01L 21/28026* (2013.01); *H01L 21/82345* (2013.01)

(56) References Cited

U.S. PATENT DOCUMENTS

| | | | |
|---|---|---|---|
| 8,884,340 B2 * | 11/2014 | Kim | H01L 27/10873 257/270 |
| 8,921,899 B2 | 12/2014 | Juengling et al. | |
| 9,064,956 B2 | 6/2015 | Oh et al. | |
| 9,129,945 B2 | 9/2015 | Lee et al. | |
| 9,349,858 B2 | 5/2016 | Hwang et al. | |
| 9,502,526 B2 | 11/2016 | Jang | |
| 9,589,960 B1 | 3/2017 | Min | |
| 9,601,590 B2 | 3/2017 | Kang | |
| 9,634,011 B2 | 4/2017 | Kang et al. | |
| 2005/0104093 A1 | 5/2005 | Yoshimochi | |
| 2007/0190728 A1 | 8/2007 | Sreekantham et al. | |
| 2007/0194374 A1 | 8/2007 | Bhalla et al. | |
| 2008/0265289 A1 | 10/2008 | Bhalla et al. | |
| 2013/0078792 A1 * | 3/2013 | Huang | H01L 29/66545 438/591 |
| 2013/0273727 A1 | 10/2013 | Lee et al. | |
| 2014/0061781 A1 | 3/2014 | Kim | |
| 2014/0159145 A1 * | 6/2014 | Park | H01L 29/66621 257/330 |
| 2014/0284708 A1 * | 9/2014 | Nishiwaki | H01L 29/66719 257/330 |
| 2014/0367774 A1 | 12/2014 | Yoo et al. | |
| 2015/0214362 A1 | 7/2015 | Oh | |
| 2015/0263111 A1 * | 9/2015 | Jang | H01L 21/0228 257/331 |
| 2015/0349073 A1 | 12/2015 | Kang | |
| 2016/0056160 A1 | 2/2016 | Jang et al. | |
| 2016/0172488 A1 | 6/2016 | Oh et al. | |
| 2017/0125408 A1 | 5/2017 | Park et al. | |
| 2017/0125422 A1 | 5/2017 | Kang | |
| 2017/0125532 A1 | 5/2017 | Jang | |
| 2017/0186844 A1 | 6/2017 | Kim et al. | |
| 2017/0365608 A1 | 12/2017 | Lee et al. | |
| 2018/0053769 A1 | 2/2018 | Kim et al. | |
| 2018/0358448 A1 * | 12/2018 | Chiang | H01L 21/823842 |
| 2019/0006488 A1 * | 1/2019 | Cheng | H01L 21/823857 |
| 2019/0088657 A1 * | 3/2019 | Im | H01L 29/518 |
| 2019/0148539 A1 * | 5/2019 | Yang | H01L 27/0886 257/401 |
| 2019/0165113 A1 * | 5/2019 | Lin | H01L 29/785 |
| 2020/0006072 A1 * | 1/2020 | Peng | H01L 21/02167 |

OTHER PUBLICATIONS

Office Action dated May 4, 2020 for U.S. Appl. No. 16/805,585.

* cited by examiner

SEMICONDUCTOR MEMORY DEVICE AND METHOD OF FABRICATING THE SAME

CROSS-REFERENCE TO RELATED APPLICATIONS

This U.S. non-provisional patent application is a continuation of U.S. application Ser. No. 16/050,848, filed on Jul. 31, 2018 in the U.S. Patent and Trademark Office, which in turn claims priority under 35 U.S.C. § 119 from, and the benefit of, Korean Patent Application No. 10-2017-0119715, filed on Sep. 18, 2017 in the Korean Intellectual Property Office, the contents of which are herein incorporated by reference in their entirety.

BACKGROUND

Embodiments of the present disclosure are directed to a semiconductor memory device and a method of fabricating the same, and in particular, to a semiconductor memory device that includes buried gate lines and a method of fabricating the same.

Due to their small-sized, multifunctional, or low-cost characteristics, semiconductor devices are important elements in the electronic industry. Semiconductor devices can be classified into semiconductor memory devices for storing data, semiconductor logic devices for processing data, and hybrid semiconductor devices that include both memory and logic elements.

Due to increasing demand for high speed low-power electronic devices, semiconductor devices require a fast operating speed or a low operating voltage. To satisfy this demand, a semiconductor device needs a high integration density, that is, more elements per area. However, an increase in the integration density can lead to a decrease in the reliability of the semiconductor device.

In a dual work function metal gate structure, a tungsten electrode is provided at a lower level, and an n-doped poly-silicon is provided at an upper level. In this structure, owing to a subsequent thermal treatment process, intermixing between the two materials can occur. To prevent this intermixing, a barrier layer having a low resistance property is used.

In a conventional technology, a $SiO_2$-based material is used as the barrier layer. If such a $SiO_2$-based barrier layer has a thickness of 10 Å or more, it can act as an insulating layer, which can lead to a deterioration of the electric characteristics of the semiconductor device. In some cases, the barrier layer is formed by directly depositing a TiN-based metal layer and removing a sidewall portion thereof. However, in these cases, it is challenging to control dispersion errors while depositing and removing the metal layer. Moreover, during the deposition process, metal contamination can occur in a sidewall portion of a gate oxide.

SUMMARY

Some embodiments of the inventive concept can provide a semiconductor memory device that is configured to reduce gate-induced-drain-leakage (GIDL) current, and a method of fabricating the same.

Some embodiments of the inventive concept can provide a semiconductor memory device having good reliability, and a method of fabricating the same.

According to exemplary embodiments of the inventive concept, a method of fabricating a semiconductor memory device include etching a substrate to form a trench that crosses active regions of the substrate, forming a gate insulating layer on bottom and side surfaces of the trench, forming a first gate electrode on the gate insulating layer that fills a lower portion of the trench, oxidizing a top surface of the first gate electrode to form a preliminary barrier layer, nitrifying the preliminary barrier layer to form a barrier layer, and forming a second gate electrode on the barrier layer that fills an upper portion of the trench.

According to exemplary embodiments of the inventive concept, a semiconductor memory device includes a semiconductor substrate that includes a trench, a gate insulating layer disposed in the trench that covers bottom and inner side surfaces of the trench, a first gate electrode disposed in a lower portion of the trench, the first gate electrode including a first metal, a second gate electrode disposed in the trench and on the first gate electrode, and a barrier layer provided between the first and second gate electrodes, the barrier layer including an oxynitride of the first metal. A work-function of the second gate electrode is lower than a work-function of the first gate electrode.

According to exemplary embodiments of the inventive concept, a semiconductor memory device includes a substrate that includes active regions surrounded by a device isolation layer, the active regions extending in a first direction, gate lines buried in trenches formed in an upper portion of the substrate, where the gate lines cross the active regions in a second direction that crosses the first direction and divide the active regions into first and second doped regions, and a bit line disposed on the gate lines that extends in a third direction that crosses both of the first and second directions. Each of the gate lines includes a first gate electrode disposed in a lower portion of the trench, where a top surface of the first gate electrode includes oxygen and nitrogen atoms, and a second gate electrode disposed on the first gate electrode.

It should be noted that these drawings are not to scale and may not precisely reflect the precise structural or performance characteristics of any given embodiment. The use of similar or identical reference numbers in the various drawings may indicate the presence of a similar or identical element or feature.

DETAILED DESCRIPTION

Exemplary embodiments of the inventive concepts will now be described more fully with reference to the accompanying drawings, in which exemplary embodiments are shown.

Figure 1:
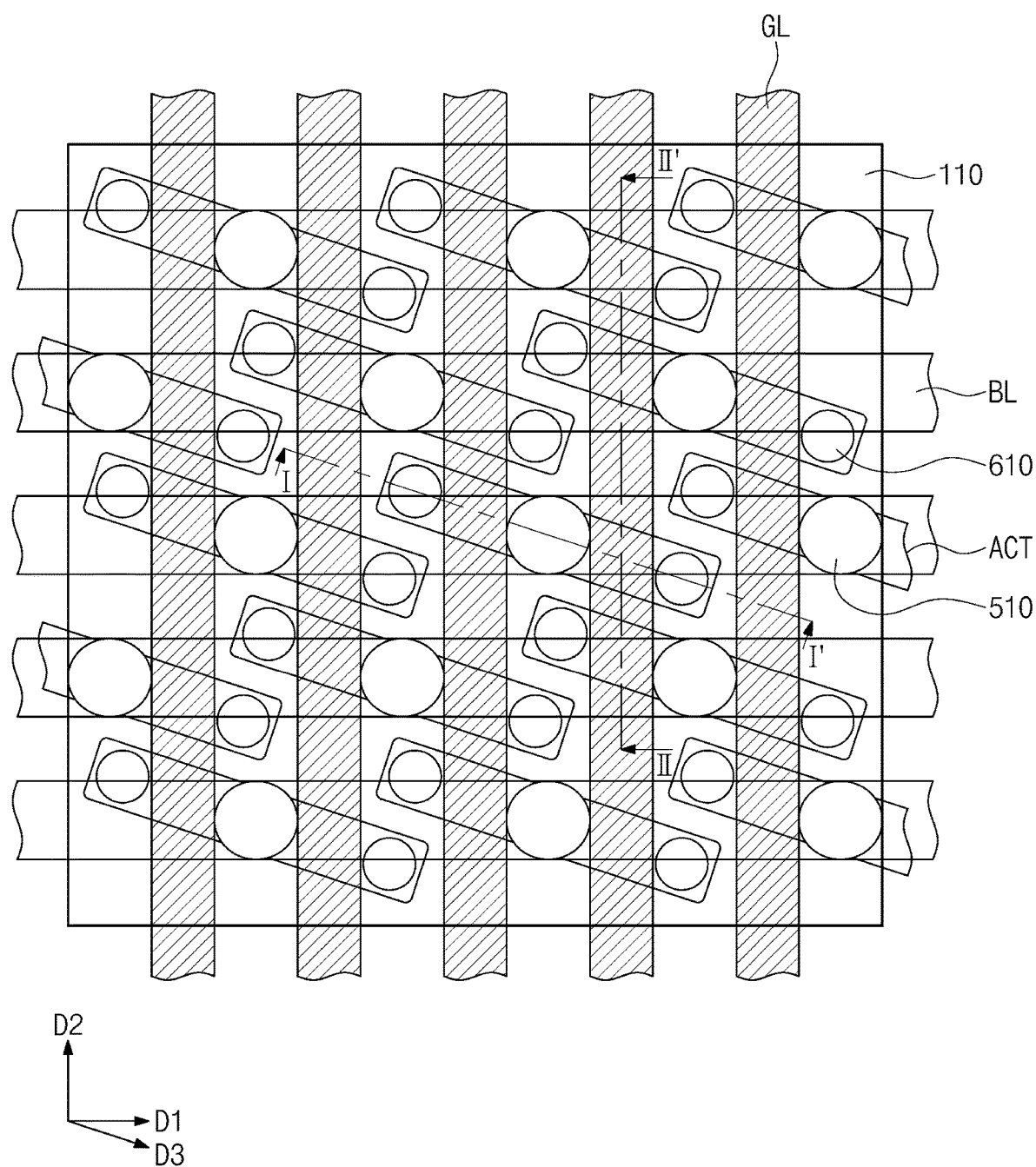
FIG. 1 is a plan view of a semiconductor memory device according to some embodiments of the inventive concept.
Figure 2A:
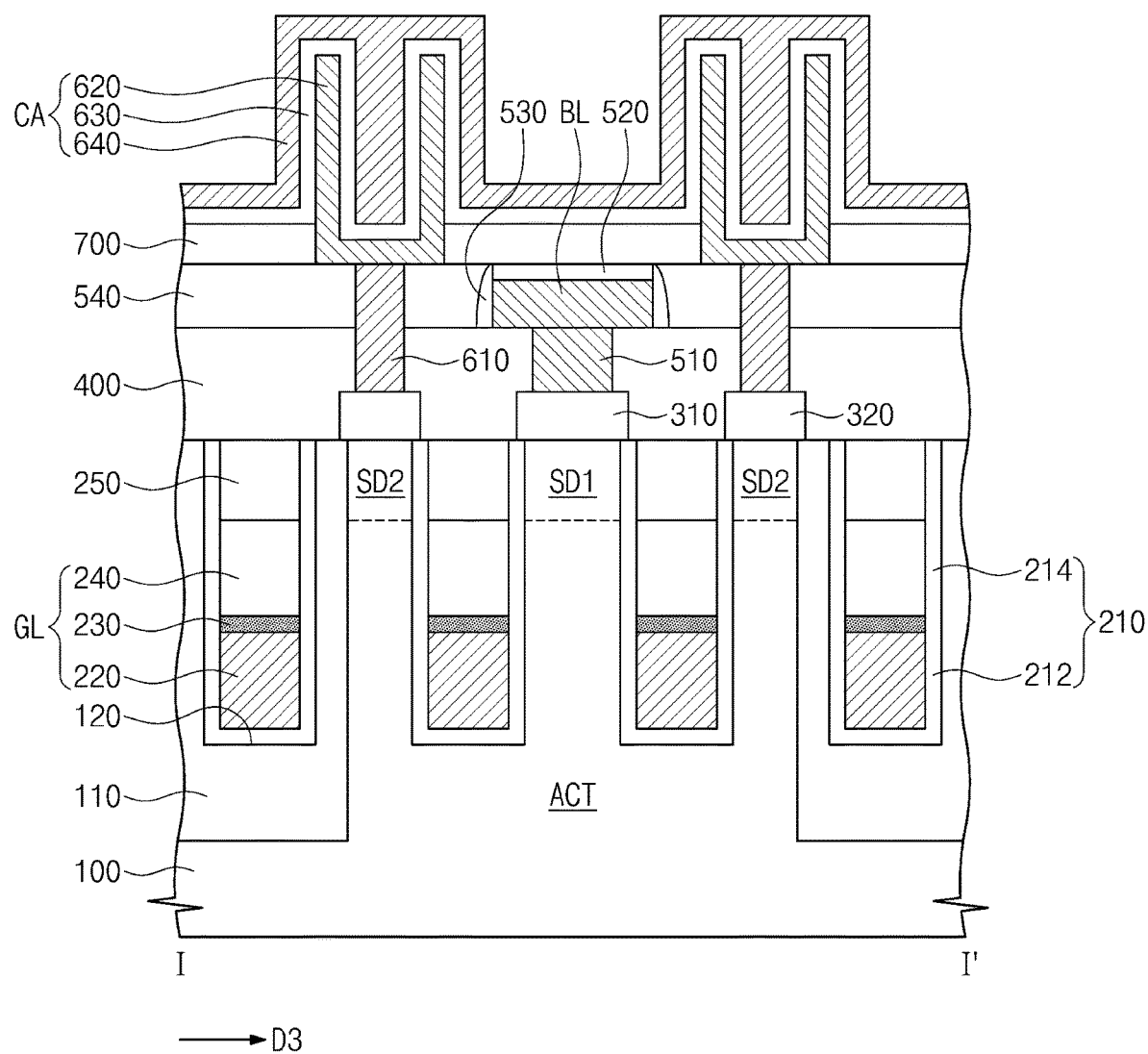
FIGS. 2A and 2B are sectional views of a semiconductor memory device according to some embodiments of the inventive concept.
Figure 2B:
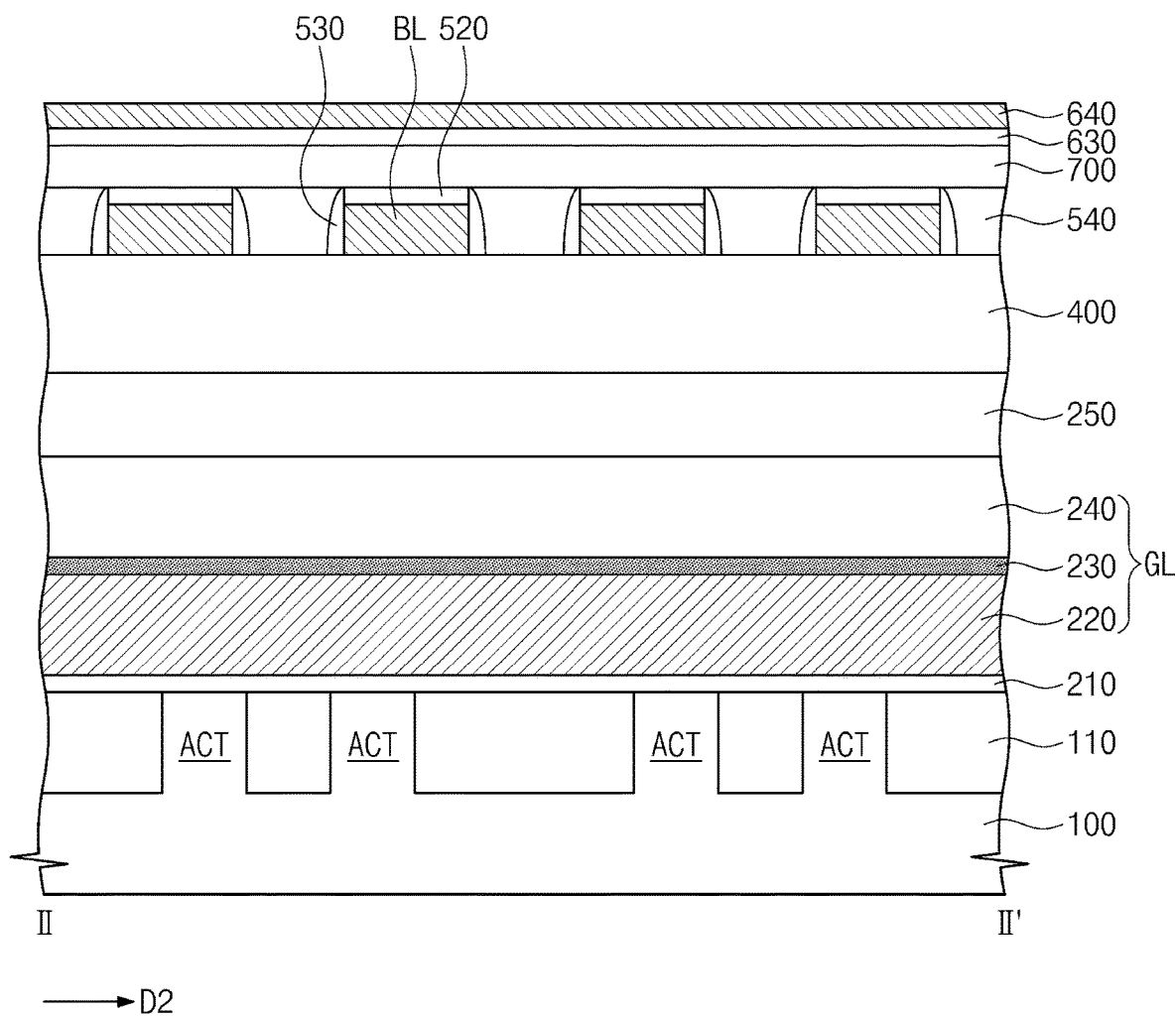

FIG. 1 is a plan view of a semiconductor memory device according to some embodiments of the inventive concept. FIGS. 2A and 2B are sectional views taken along lines I-I' and II-I', respectively, of FIG. 1, that illustrate a semiconductor memory device according to some embodiments of the inventive concept. FIGS. 3 to 6 are sectional views taken along line I-I' of FIG. 1 that illustrate a semiconductor memory device according to some embodiments of the inventive concept.

In the present specification, a first direction D1, a second direction D2, and a third direction D3, which are defined on the same plane, will be used to scribe directional aspects of an element. The first direction D1 and the second direction D2 are perpendicular to each other, and the third direction D3 is not parallel to either of the first or second directions D1 and D2. FIG. 2A shows a cross section taken in the third direction D3, and FIG. 2B shows a cross section taken in the second direction D2.

According to some embodiments, referring to FIGS. 1, 2A, and 2B, a device isolation layer 110 is provided in a substrate 100 to define active regions ACT. The substrate 100 includes a semiconductor substrate. For example, the semiconductor substrate may be or include a silicon wafer, a germanium wafer, or a silicon-germanium wafer. When viewed in a plan view, each of the active regions ACT has a bar-like shape that extends in the third direction D3.

According to some embodiments, gate lines GL are provided in the substrate 100 to cross the active regions ACT, when viewed in a plan view. The gate lines GL can be used as word lines. The gate lines GL extend in the second direction D2 and are arranged in the first direction D1. The gate lines GL are buried in the substrate 100. For example, the gate lines GL can be provided in trenches 120 of the substrate 100. The trenches 120 extend to cross the active regions ACT.

According to some embodiments, each of the gate lines GL includes a first gate electrode 220, a barrier layer 230, and a second gate electrode 240. The first gate electrode 220 is provided in the trench 120. The first gate electrode 220 partially fills the trench 120. The first gate electrode 220 fills a lower portion of the trench 120. The first gate electrode 220 is formed of or includes at least one metal such as tungsten (W), titanium (Ti), or tantalum (Ta).

Figure 3:
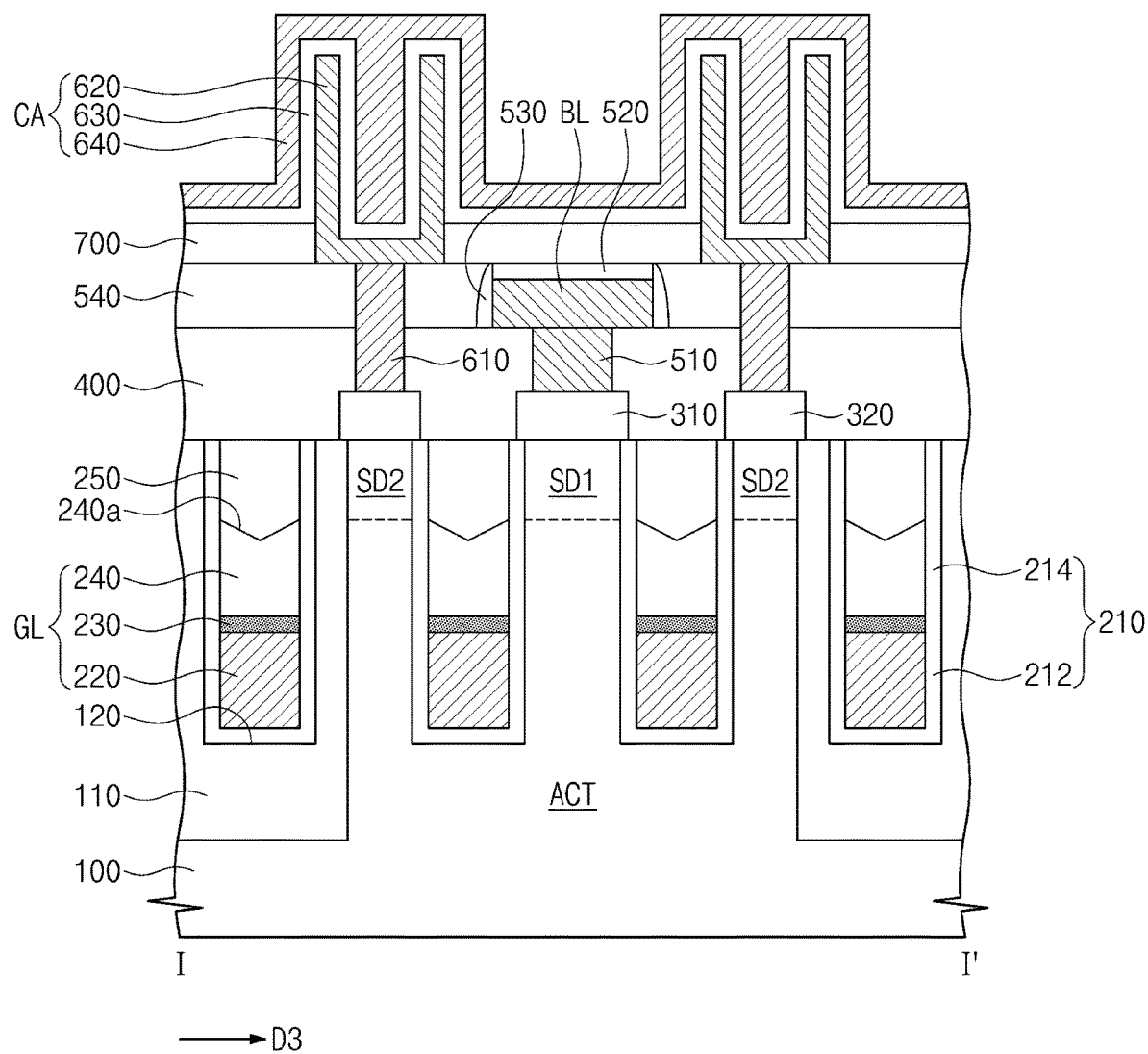
FIGS. 3, 4, 5 and 6 are sectional views that illustrate a semiconductor memory device according to some embodiments of the inventive concept.

According to some embodiments, the second gate electrode 240 is disposed on the first gate electrode 220 to fill a portion of the trench 120. When viewed in a plan view, the second gate electrode 240 overlaps the first gate electrode 220. For example, each of the first and second gate electrodes 220 and 240 extends in the second direction D2. The second gate electrode 240 covers a top surface of the first gate electrode 220. A top surface of the second gate electrode 240 is positioned at a level below that of a top surface of the substrate 100. A work-function of the second gate electrode 240 is lower than that of the first gate electrode 220. The second gate electrode 240 is formed of or includes polysilicon that is doped with n-type impurities. FIG. 2A illustrates an example in which the second gate electrode 240 has a flat top surface, but embodiments of the inventive concept are not limited thereto. As shown in FIG. 3, the top surface 240a of the second gate electrode 240 has an inwardly recessed shape, i.e., a shape recessed toward the first gate electrode 220. For example, the top surface 240a of the second gate electrode 240 has a "V"-shaped section. In certain embodiments, the top surface 240a of the second gate electrode 240 has a "U"-shaped section.

According to some embodiments, the barrier layer 230 is disposed between the first and second gate electrodes 220 and 240. Owing to the barrier layer 230, the first and second gate electrodes 220 and 240 are not be in contact with each other or are spaced apart from each other. The barrier layer 230 can prevent silicon atoms in the second gate electrode 240 from diffusing into the first gate electrode 220, and thus can prevent a metal silicide layer from being formed in the first gate electrode 220. In addition, the barrier layer 230 can prevent n-type impurities, such as phosphorus (P), in the second gate electrode 240 from diffusing into the first gate electrode 220, and thus can prevent undesired materials, such as tungsten phosphide ($WP_2$), from forming in the first gate electrode 220. The barrier layer 230 is a thin film. For example, the barrier layer 230 has a thickness ranging from about 1 Å to about 50 Å. If the thickness of the barrier layer 230 is less than 1 Å, silicon atoms in the second gate electrode 240 can diffuse through the barrier layer 230 and into the first gate electrode 220. If the thickness of the barrier layer 230 is greater than 50 Å, an electrical resistance between the first and second gate electrodes 220 and 240 can increase, which can deteriorate electric characteristics of the gate lines GL. The barrier layer 230 is formed of or includes a metal oxynitride of a metallic element such as tungsten (W), titanium (Ti), or tantalum (Ta). Here, the metallic element of the first gate electrode 220 is the same as that in the metal oxynitride of the barrier layer 230. For example, the first gate electrode 220 can be formed of or includes tungsten (W), and the barrier layer 230 is formed of or includes tungsten oxynitride.

In certain embodiments, the barrier layer 230 is formed of or includes metal nitrides of a metal such as tungsten (W), titanium (Ti), or tantalum (Ta). Here, the metallic element of the first gate electrode 220 is the same as that in the metal nitride of the barrier layer 230. For example, the first gate electrode 220 can be formed of tungsten (W) and the barrier layer 230 is formed of tungsten nitride.

Figure 4:
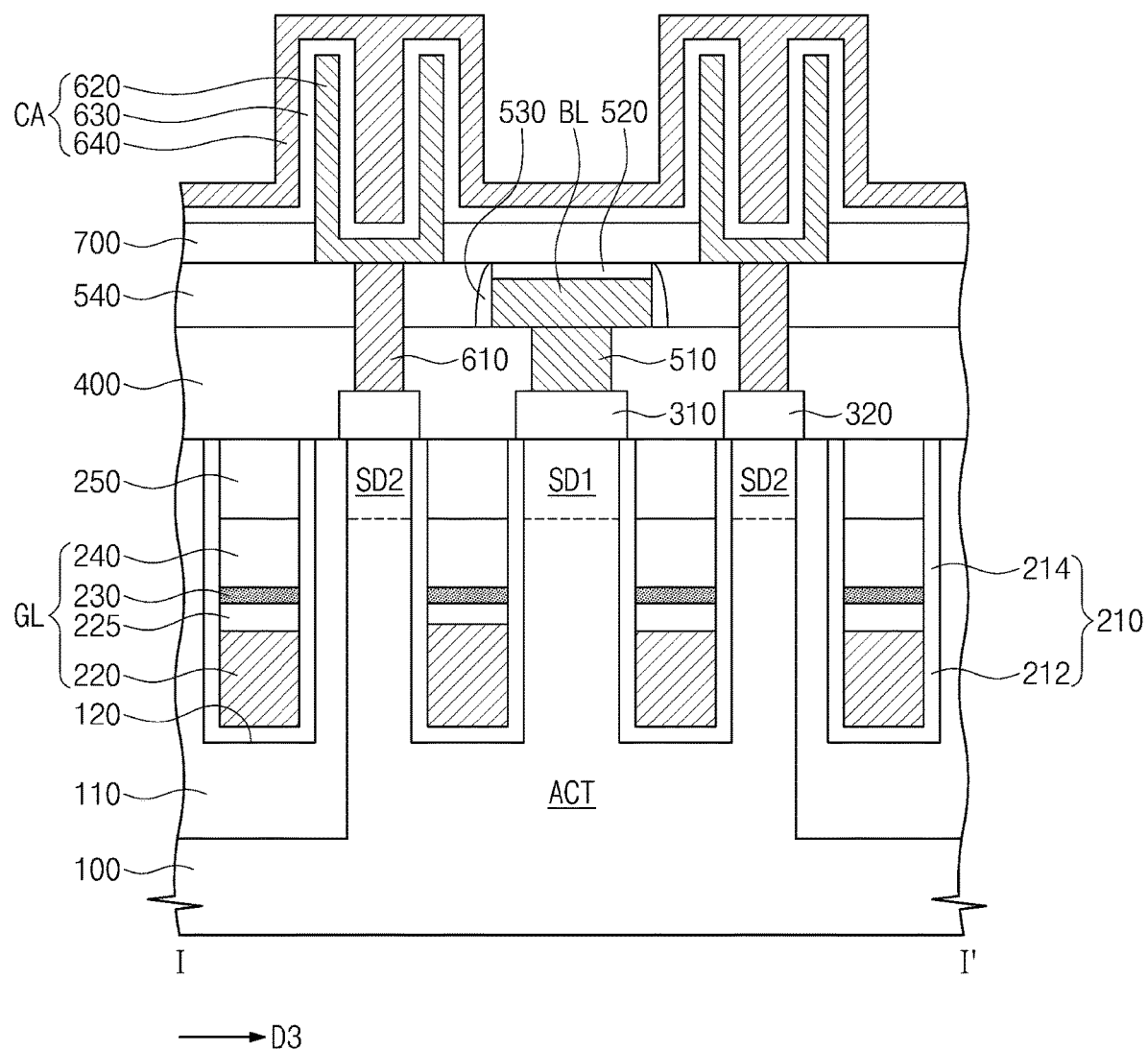

In some embodiments, a work function adjusting layer 225 is interposed between the first gate electrode 220 and the barrier layer 230. As shown in FIG. 4, the work function adjusting layer 225 is provided to adjust a work function of the gate lines GL. As an example, the work function adjusting layer 225 has a work function lower than that of the first gate electrode 220. A thickness of the work function adjusting layer 225 may be adjusted in consideration of a work function required for the gate lines GL, or may be doped with a work function adjusting element, such as lanthanum (La) or hafnium(Hf), in consideration of a work function required for the gate lines GL. The work function adjusting layer 225 is formed of or includes at least one of a binary metal nitride, such as titanium nitride(TiN) or tantalum nitride(TaN)), a ternary metal nitride, such as titanium aluminum nitride(TiAlN), tantalum aluminum nitride (TaAlN), titanium silicon nitride(TiSiN), or tantalum silicon nitride(TaSiN)), or a metal oxynitride obtained by oxidizing them.

According to some embodiments, a gate insulating layer 210 is interposed between the gate lines GL and the active regions ACT and between the gate lines GL and the device isolation layer 110. The gate insulating layer 210 is formed of or includes at least one of an oxide, a nitride, or an oxynitride. Here, a nitrogen concentration of a second portion 214 of the gate insulating layer 210 adjacent to the second gate electrode 240 is greater than a nitrogen concentration of a first portion 212 of the gate insulating layer 210 adjacent to the first gate electrode 220. For example, the concentration of N+ ions in the second portion 214 is greater than that in the first portion 212. The N+ ions in the second portion 214 can reduce leakage current through the gate insulating layer 210, which can improve the reliability of a semiconductor memory device.

Figure 5:
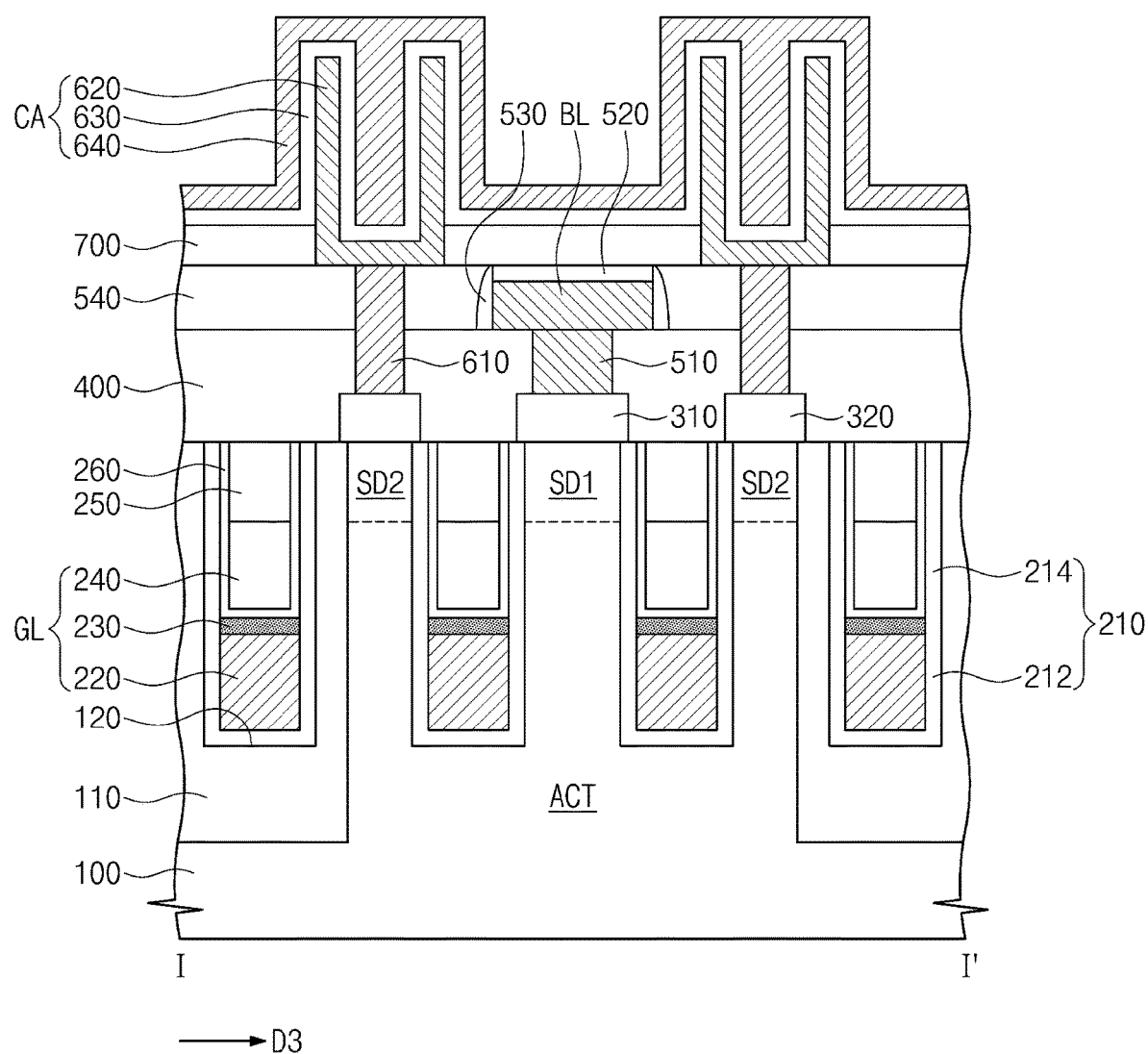

In some embodiments, referring now to FIG. 3, a liner layer 260 is interposed between the second gate electrode 240 and the gate insulating layer 210. As shown in FIG. 5, the liner layer 260 covers an inner side surface of the gate insulating layer 210 and a top surface of the second gate electrode 240. The liner layer 260 extends into a space between the gate insulating layer 210 and the second gate electrode 240. The liner layer 260 is formed of or includes metal nitride. For example, the liner layer 260 can be formed of or includes titanium nitride. Hereinafter, a semiconductor memory device in which the liner layer 260 is not provided will be described.

According to some embodiments, referring back to FIGS. 1, 2A, and 2B, first capping layers 250 may be provided on the gate lines GL. The first capping layers 250 are disposed to fill the remaining spaces of the trenches 120. A top surface of the first capping layers 250 is positioned at the same level as the top surface of the substrate 100. The first capping layers 250 are formed of or include at least one of silicon oxide, silicon nitride, or silicon oxynitride. Both side surfaces of each of the first capping layers 250 are next to the active regions ACT and the device isolation layer 110. The gate insulating layers 210 is interposed between the first capping layers 250 and the active regions ACT and functions as a buffer layer that reduces stress between the active regions ACT and the first capping layers 250. In certain embodiments, the gate insulating layers 210 do not extend into gaps between the active regions ACT and the first capping layers 250 or between the device isolation layer 110 and the first capping layers 250. For example, the uppermost portions of the gate insulating layers 210 are in contact with side surfaces of the first capping layers 250.

According to some embodiments, a first doped region SD1 and a second doped region SD2 are provided in two of the active regions ACT adjacent to both sides surfaces of the gate lines GL. The first and second doped regions SD1 and SD2 are formed below the top surface of the substrate 100 or in the substrate 100. The first and second doped regions SD1 and SD2 have a conductivity type different from that of the substrate 100. For example, when the substrate 100 is p-type, the first and second doped regions SD1 and SD2 are n-type. The first and second doped regions SD1 and SD2 can be used as a source or drain region.

According to some embodiments, a first pad 310 and a second pad 320 are disposed on the substrate 100, and in some embodiments, the first pad 310 and the second pad 320 are connected to the first doped region SD1 and the second doped region SD2, respectively. The first pad 310 and the second pad 320 are formed of or include at least one conductive material, such as doped poly silicon or a metal.

According to some embodiments, a first interlayer insulating layer 400 is disposed on the first and second pads 310 and 320. The first interlayer insulating layer 400 is formed of or includes at least one of a silicon oxide layer, a silicon nitride layer, or a silicon oxynitride layer.

According to some embodiments, bit lines BL are disposed on the first interlayer insulating layer 400. The bit lines BL are disposed on the first interlayer insulating layer 400 and in a second interlayer insulating layer 540. The second interlayer insulating layer 540 is formed of or includes a silicon oxide layer, a silicon nitride layer, or a silicon oxynitride layer. Each of the bit lines BL is connected to the first pad 310 through a first contact 510, which penetrates the first interlayer insulating layer 400. The bit lines BL and the first contact 510 are formed of or include at least one conductive material, such as doped silicon or a metal.

According to some embodiments, second capping layers 520 are disposed on the bit lines BL, and insulating spacers 530 are provided that cover side surfaces of the bit lines BL. The second capping layers 520 and the insulating spacers 530 are formed of or include at least one of silicon nitride, silicon oxide, or silicon oxynitride.

According to some embodiments, a second contact 610 is disposed on the substrate 100. The second contact 610 penetrates the first and second interlayer insulating layers 400 and 540 and is connected to the second pad 320. The second contact 610 is formed of or includes at least one conductive material, such as doped silicon or a metal.

According to some embodiments, a data storage element connected to the second contact 610 is disposed on the second interlayer insulating layer 540. For example, the data storage element is or includes a capacitor CA that includes a first electrode 620, a second electrode 640, and a dielectric layer 630 interposed between the first electrode 620 and the second electrode 640. The first electrode 620 is shaped like a cylinder with closed bottom. The second electrode 640 covers the first electrode 620. The first electrode 620 and the second electrode 640 are formed of or include at least one of doped silicon, a metal, or a metal compound.

According to some embodiments, a supporting layer 700 is disposed between the second electrode 640 and the second interlayer insulating layer 540. The supporting layer 700 is disposed on an outer sidewall of the first electrode 620, thereby preventing the first electrode 620 from leaning or falling. The supporting layer 700 is formed of or includes an insulating material.

Figure 6:
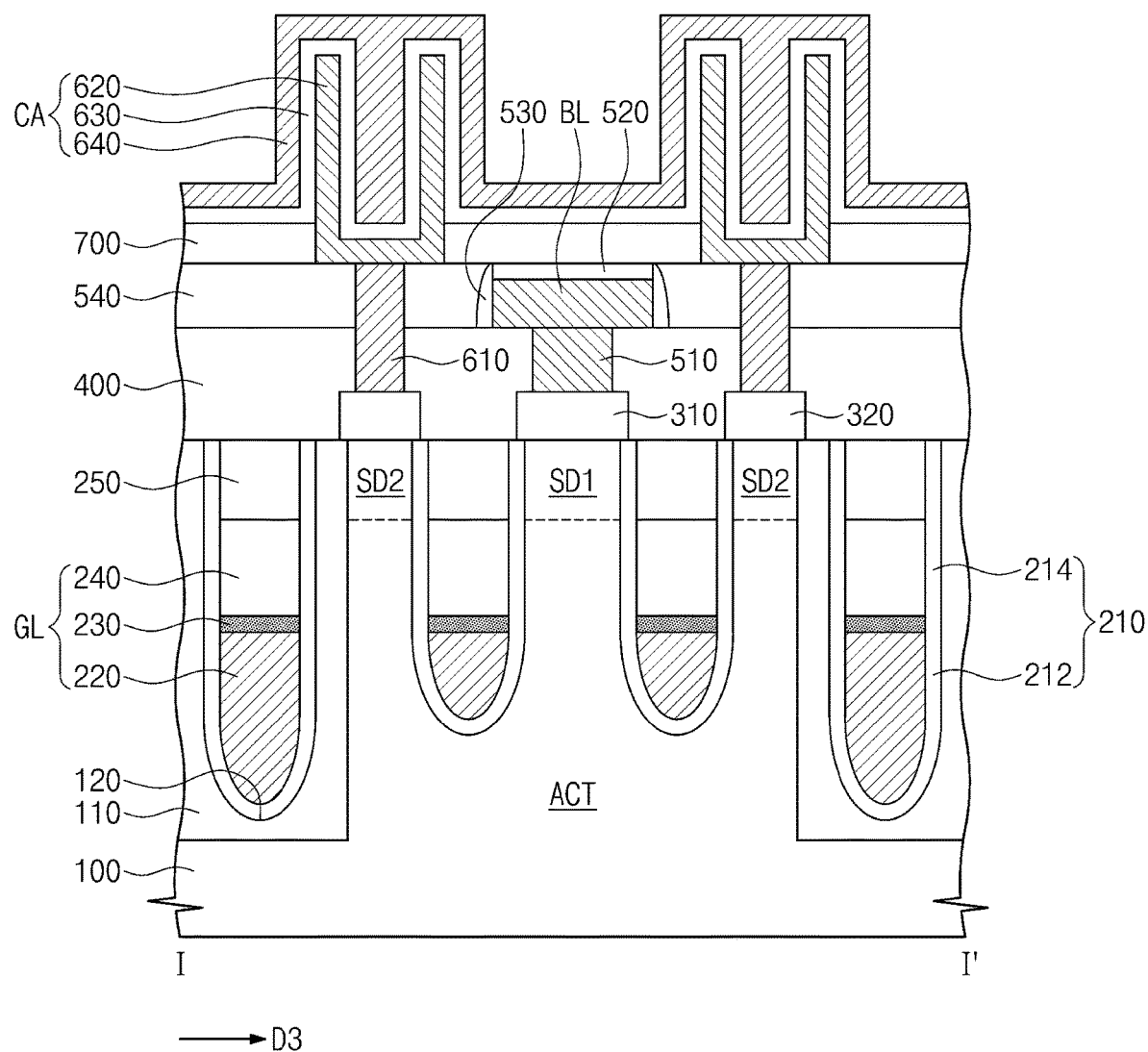

For convenience in illustration, FIG. 2A illustrates an example in which lower portions of the gate lines GL have a rectangular shape, but embodiments of the inventive concept are not limited thereto. For example, as shown in FIG. 6, a lower region of the trench 120 has a "U"-shaped section, and thus, the gate line GL filling the trench 120 has a rounded lower portion. In certain embodiments, the gate lines GL are provided at different depths, according to their positions. As an example, to reduce a length of a channel region that is formed in the active region ACT between the first and second doped regions SD1 and SD2, the gate lines GL on the active regions ACT can be formed at a relatively high level. For example, the bottom portions of the gate lines GL in the device isolation layer 110 can be lower than those on the active regions ACT.

In a semiconductor memory device according to some embodiments of the inventive concept, each of the gate lines GL includes the first gate electrode 220, which is located at a low level and has a high work-function, and the second gate electrode 240, which is located at a high level and has a low work-function. The second gate electrode 240 can reduce leakage current, such as gate-induced-drain-leakage (GIDL) current, which can occur in the doped regions SD1 or SD2 by the gate lines GL.

In addition, according to some embodiments, the barrier layer 230 can prevent silicon atoms or n-type impurities in the second gate electrode 240 from diffusing into the first gate electrode 220 and can prevent a metal silicide or a metal nitride from forming in the first gate electrode 220. Accordingly, electric characteristics of the gate lines GL can be improved.

Furthermore, according to some embodiments, the N+ ions in the second portion 214 of the gate insulating layer 210 contribute to reducing leakage current into the gate insulating layer 210, which can improve reliability of a semiconductor memory device.

Figure 7:
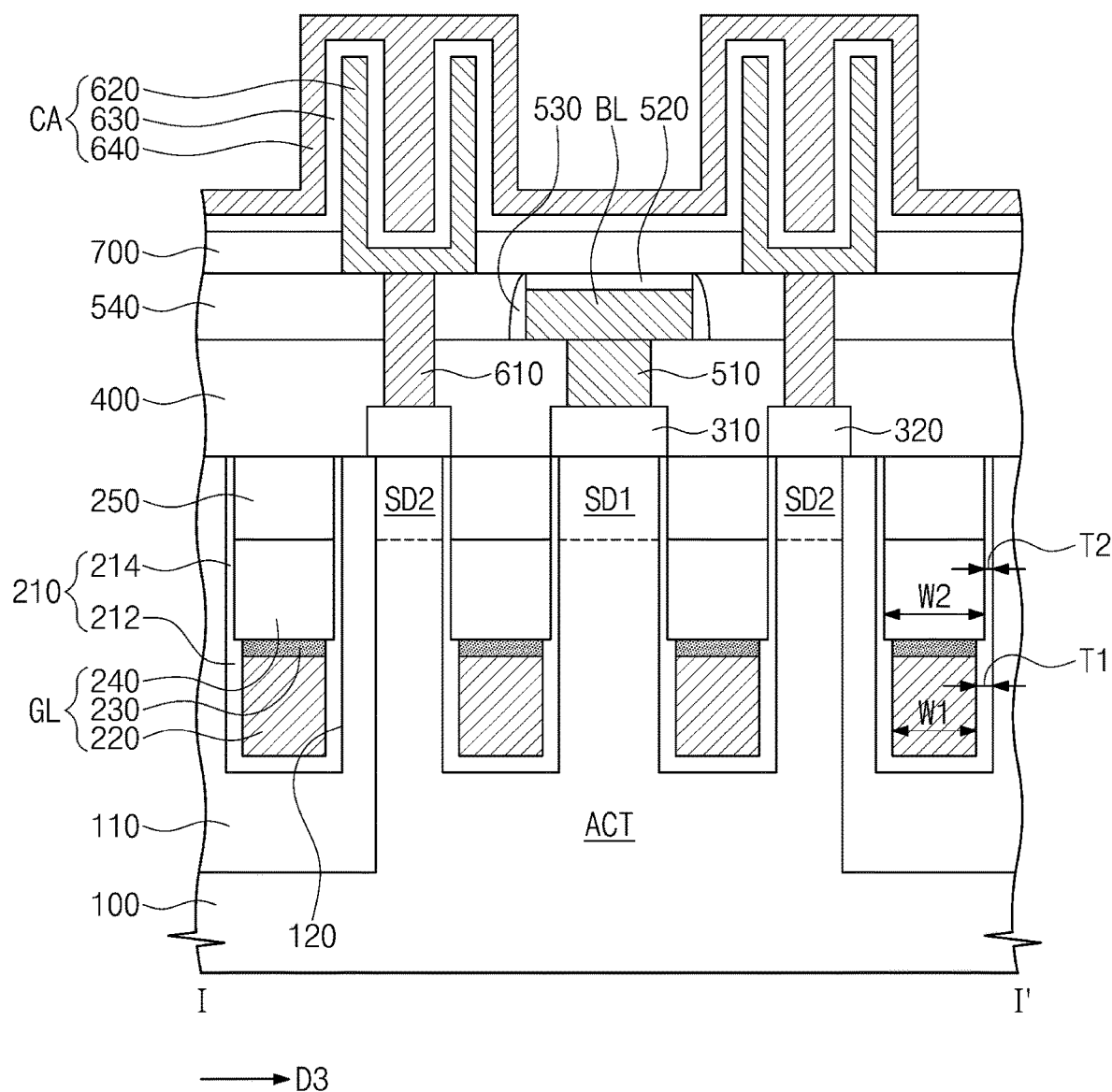
FIG. 7 is a sectional view of a semiconductor memory device according to some embodiments of the inventive concept.

FIG. 7 is a sectional view of a semiconductor memory device according to some embodiments of the inventive concept and corresponds to a section taken along line I-I' of FIG. 1.

According to some embodiments, referring to FIGS. 1, 2B, and 7, a width of the second gate electrode 240 is greater than that of the first gate electrode 220. When measured in a direction normal to a side surface of the trench 120, a thickness T1 of the first portion 212 of the gate insulating layer 210 is greater than a thickness T2 of the second portion 214 of the gate insulating layer 210. In detail, when compared with an inner sidewall of the first portion 212, an inner sidewall of the second portion 214 is recessed out toward the sidewall of the trench 120. Since the second portion 214 adjacent to the second gate electrode 240 is thinner than the first portion 212 of the gate insulating layer 210, a strong electric field can be generated between the second gate electrode 240 and the doped regions SD1 and SD2. Accordingly, electric characteristics between the second gate electrode 240 and the doped regions SD1 and SD2 can be improved. The thickness T1 of the first portion 212 is about 40% to 70% greater than the thickness T2 of the second portion 214. If the thickness T1 is less than about 40% greater than the thickness T2, leakage current, such as GIDL current, in the doped regions SD1 and SD2 can increase. If the thickness T1 is more than about 70% greater than the thickness T2, a strong electric field is not generated between the second gate electrode 240 and the doped regions SD1 and SD2.

In addition, according to some embodiments, a nitrogen concentration of the second portion 214 of the gate insulating layer 210 is greater than that of the first portion 212 of the gate insulating layer 210. For example, the second portion 214 can have a high N+ ion concentration. The N+ ions in the second portion 214 reduce leakage current into the gate insulating layer 210, which can improve the reliability of a semiconductor memory device.

According to some embodiments, a width of a lower region of the trench 120 in which the first gate electrode 220 is disposed is less than a width of an upper region of the trench 120 in which the second gate electrode 240 is disposed. The second gate electrode 240 has a width W2 that is greater than a width W1 of the first gate electrode 220.

In some embodiments, the gate insulating layer 210 includes the second portion 214 that is thinner than the first portion 212 and contains the N+ ions. Accordingly, a strong electric field can be generated between the second gate electrode 240 and the doped regions SD1 and SD2, and owing to the N+ ions in the second portion 214, leakage current into the gate insulating layer 210 can be reduced. In other words, according to some embodiments of the inventive concept, the electric characteristics and reliability of a semiconductor memory device can be improved.

FIGS. 8A to 14A are sectional views taken along line I-I' of FIG. 1 that illustrate a method of fabricating a semiconductor memory device according to some embodiments of the inventive. FIGS. 8B to 14B are sectional views taken along line II-II' of FIG. 1 that illustrate a method of fabricating a semiconductor memory device according to some embodiments of the inventive. FIGS. 10C to 12C are enlarged views of portions 'A', i.e., a portion of a surface of a first gate electrode, of FIGS. 10A to 12A. FIG. 13C is a sectional view illustrating a process of forming a second gate electrode.

Figure 8A:
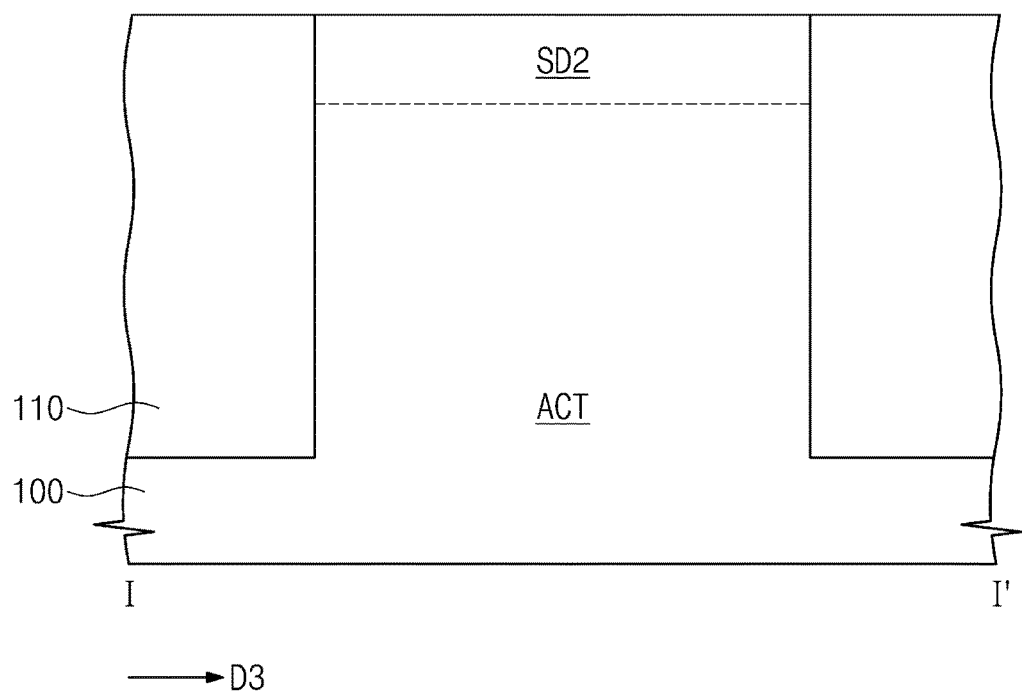
FIGS. 8A, 9A, 10A, 11A, 12A, 13A, and 14A are sectional views that illustrate a method of fabricating a semiconductor memory device according to some embodiments of the inventive concept.
Figure 8B:
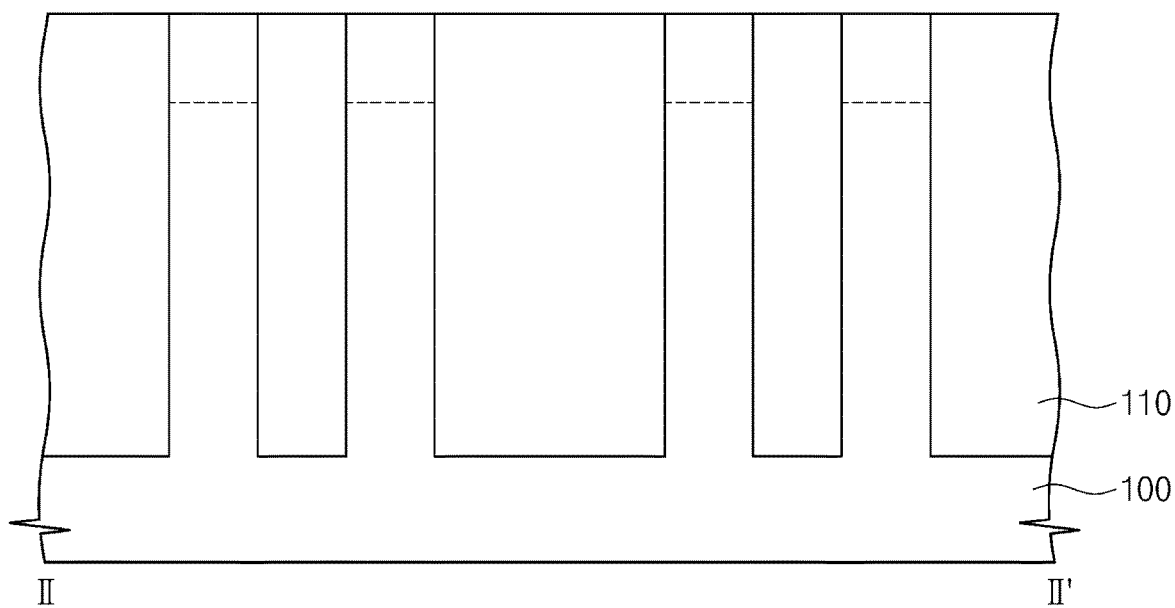
FIGS. 8B, 9B, 10B, 11B, 12B, 13B and 14B are sectional views that illustrate a method of fabricating a semiconductor memory device according to some embodiments of the inventive concept.

According to some embodiments, referring to FIGS. 1, 8A, and 8B, the device isolation layer 110 is formed in the substrate 100 that define the active regions ACT. The device isolation layer 110 includes at least one of a silicon nitride layer, a silicon oxide layer, or a silicon oxynitride layer. The device isolation layer 110 includes a portion that extends into the substrate 100.

According to some embodiments, the second doped regions SD2 is formed in the active regions ACT of the substrate 100. The second doped regions SD2 is formed by an ion implantation process. The second doped region SD2 is doped with n-type impurities.

Figure 9A:
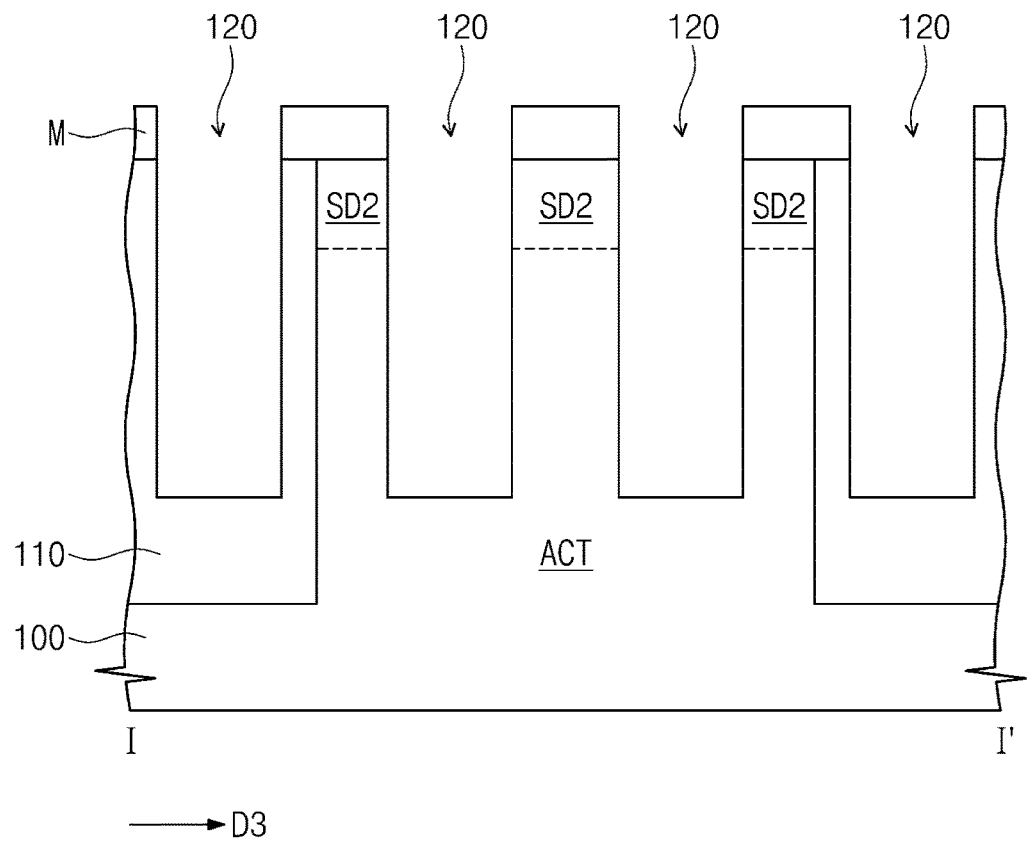
Figure 9B:
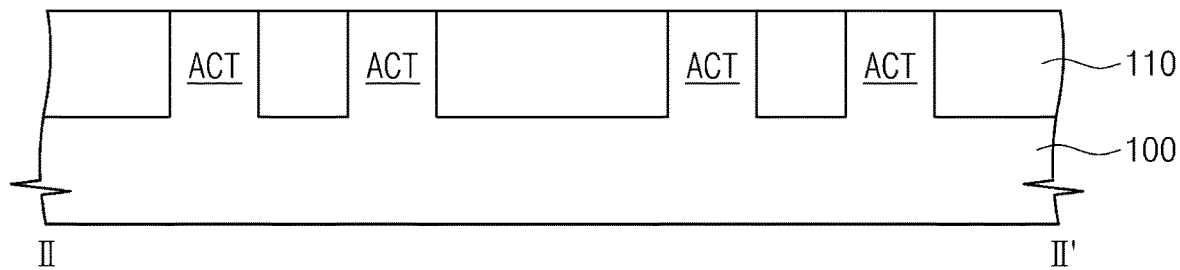

According to some embodiments, referring to FIGS. 1, 9A, and 9B, the trenches 120 are formed in an upper portion of the substrate 100. For example, forming the trenches 120 includes forming mask patterns M on the substrate 100 and then etching the substrate 100 and the device isolation layer 110 using the mask patterns M as an etch mask. Each of the trenches 120 is formed to have a line shape extending in the second direction D2. The device isolation layer 110 and the active regions ACT are exposed through the trenches 120. The mask patterns M are removed after the etching process. In FIG. 9A, the trench 120 is illustrated to have a rectangular section, but embodiments of the inventive concept are not limited thereto. In the case where the substrate 100 is etched to form the trench 120, a center region of a bottom surface of the trench 120 is more easily etched, as compared with an edge region, as shown in FIG. 7. Thus, the trench 120 can be formed to have a bottom surface whose center region is recessed, and a bottom region of the trench 120 has a "U"-shaped section. Hereinafter, for convenience in description, embodiments of the inventive concept will be described with reference to the trench 120 of FIG. 9A.

Figure 10A:
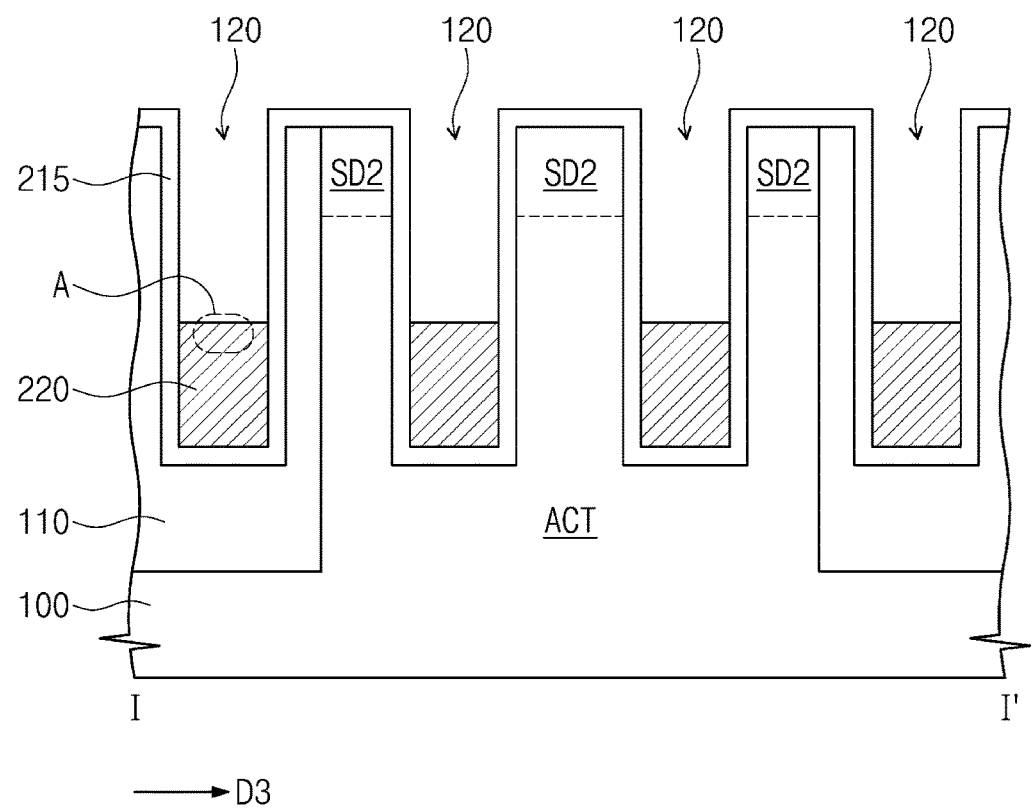
Figure 10B:
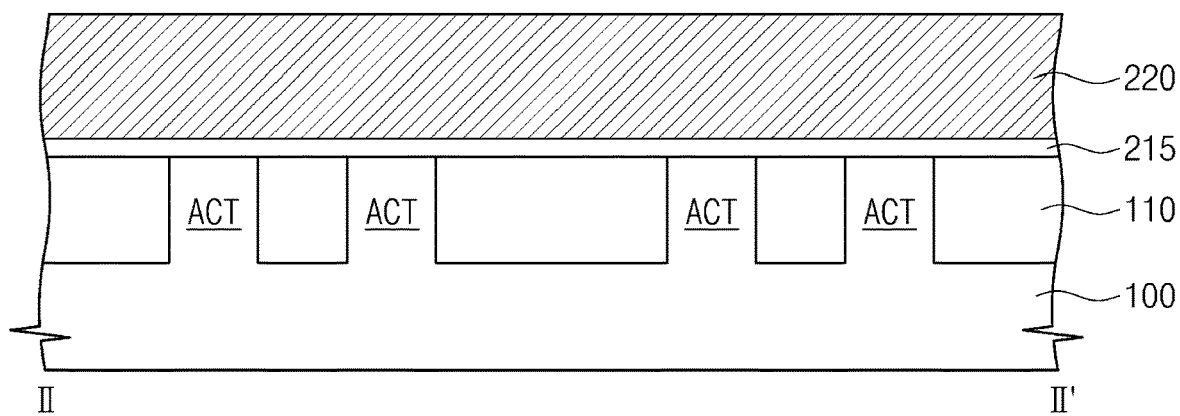

According to some embodiments, referring to FIGS. 1, 10A, and 10B, an insulating layer 215 is formed on the substrate 100 and in the trenches 120. The insulating layer 215 may be formed by, for example, a thermal oxidation process, an atomic layer deposition (ALD) process, or a chemical vapor deposition (CVD) process. The insulating layer 215 is formed to cover the top surface of the substrate 100 and side and bottom surfaces of the trenches 120. The insulating layer 215 is formed of or includes silicon oxide.

Next, according to some embodiments, the gate lines GL are formed in the trenches 120. Each of the gate lines GL includes the first gate electrode 220, the barrier layer 230, and the second gate electrode 240.

According to some embodiments, the first gate electrode 220 is formed in a lower region of each of the trenches 120 that are coated with the insulating layer 215. For example, a conductive material is deposited on the substrate 100. The conductive material is formed to fill the trenches 120. The deposition of the conductive material may be, for example, a CVD process. The conductive material includes a metallic material, such as tungsten (W), titanium (Ti), or tantalum (Ta). Thereafter, the deposited conductive material is etched to form the first gate electrode 220. The etching process is performed until the first gate electrode 220 has a desired thickness.

Figure 10C:
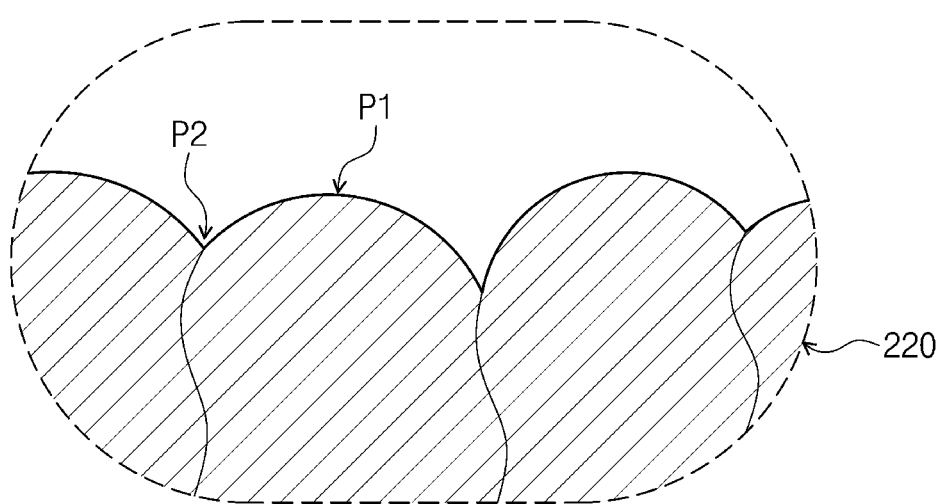
FIGS. 10C, 11C, and 12C are enlarged views of portions 'A' of FIGS. 10A to 12A, respectively.

According to some embodiments, referring to FIG. 10C, the first gate electrode 220 has a polycrystalline structure. The first gate electrode 220 includes a plurality of grains, and in this case, the first gate electrode 220 has an uneven top surface, owing to the presence of the grains. For example, the top surface of the first gate electrode 220 includes a protruding portion P1 and an indented portion P2 that is lower than the protruding portion P1. The indented portion P2 is connected to crystalline defects, such as a grain boundary between the grains, of the first gate electrode 220.

Thereafter, as previously described with reference to FIG. 4, the work function adjusting layer 225 is formed on the first gate electrode 220. For example, a work function adjusting material is deposited on the substrate 100. Here, the work function adjusting material fills the trench 120. The work function adjusting material includes metal nitrides, such as titanium nitride (TiN) or tantalum nitride (TaN). Next, the deposited work function adjusting material is etched to form the work function adjusting layer 225. In the case where the work function adjusting layer 225 is formed on the first gate electrode 220, the work function adjusting layer 225 is formed to have grains, and thus, the work function adjusting layer 225 has an uneven top surface, whose shape is determined by shapes of the grains. In certain embodiments, a process of forming the work function adjusting layer 225 is omitted. The description that follows will refer to an example of the gate lines GL of FIG. 10A without the work function adjusting layer 225.

Figure 11A:
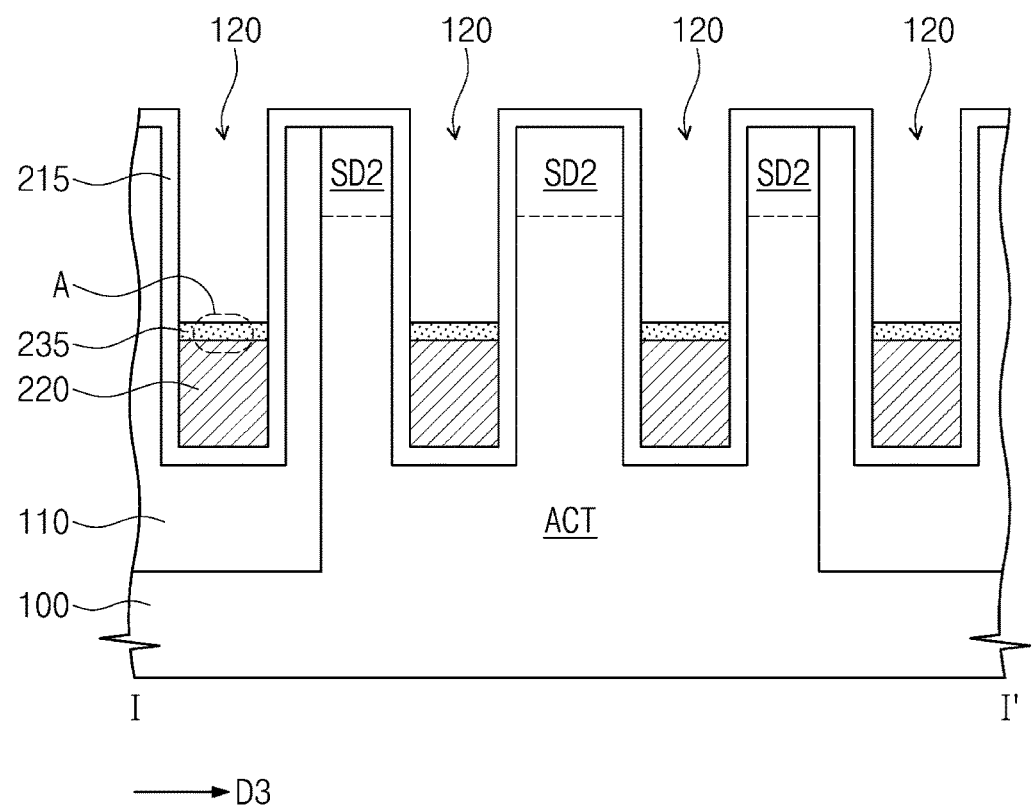
Figure 11B:
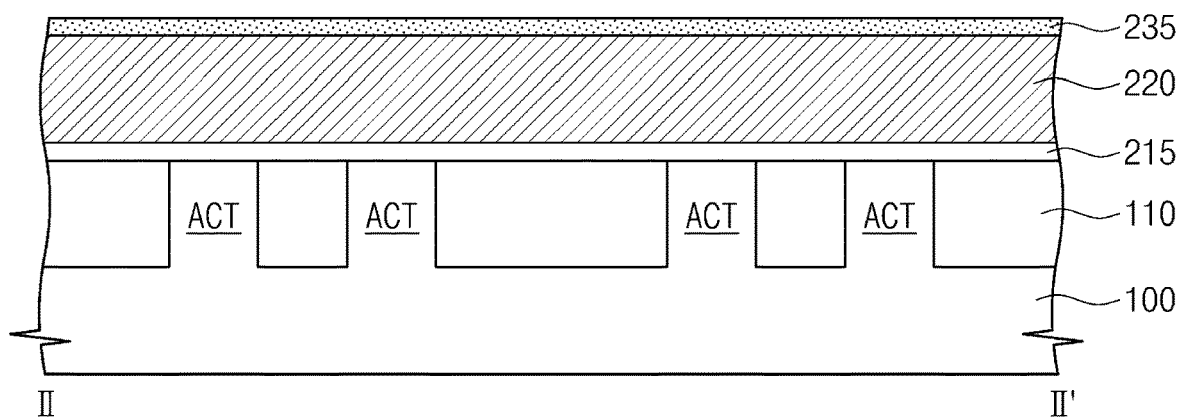

According to some embodiments, referring to FIGS. 1, 11A, and 11B, a preliminary barrier layer 235 is formed on the first gate electrode 220. In detail, a surface treatment process is performed on the top surface of the first gate electrode 220. The surface treatment process is an oxidation process. An upper portion of the first gate electrode 220 is oxidized by the surface treatment process to form the preliminary barrier layer 235.

Figure 11C:
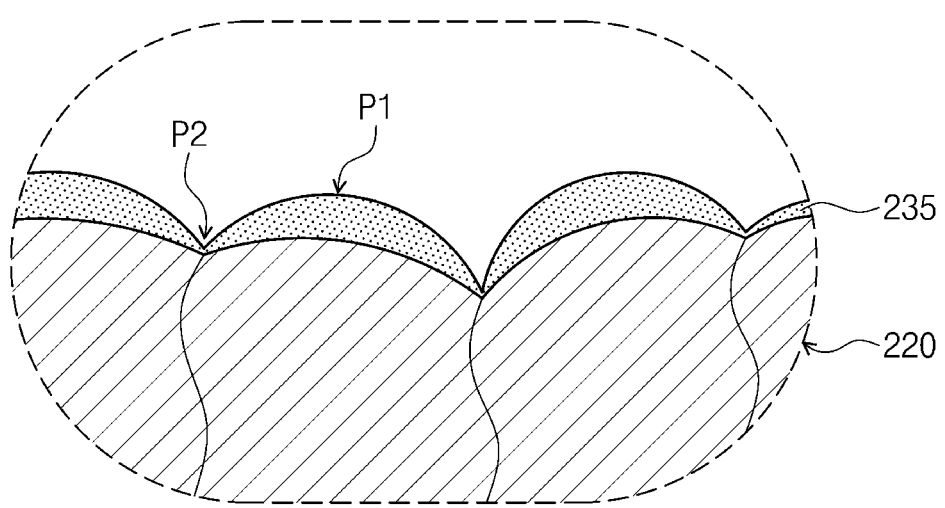

According to some embodiments, referring to FIG. 11C, owing to the uneven top surface of the first gate electrode 220, an oxidation thickness of the upper portion of the first gate electrode 220 is not uniform. For example, the protruding portion P1 is easily oxidized, because it has a relatively large exposed area. By contrast, the indented portion P2 is not easily oxidized, because it has a relatively small exposed area. Accordingly, the preliminary barrier layer 235 on the indented portion P2 is thinner than the preliminary barrier layer 235 on the protruding portion P1.

Figure 12A:
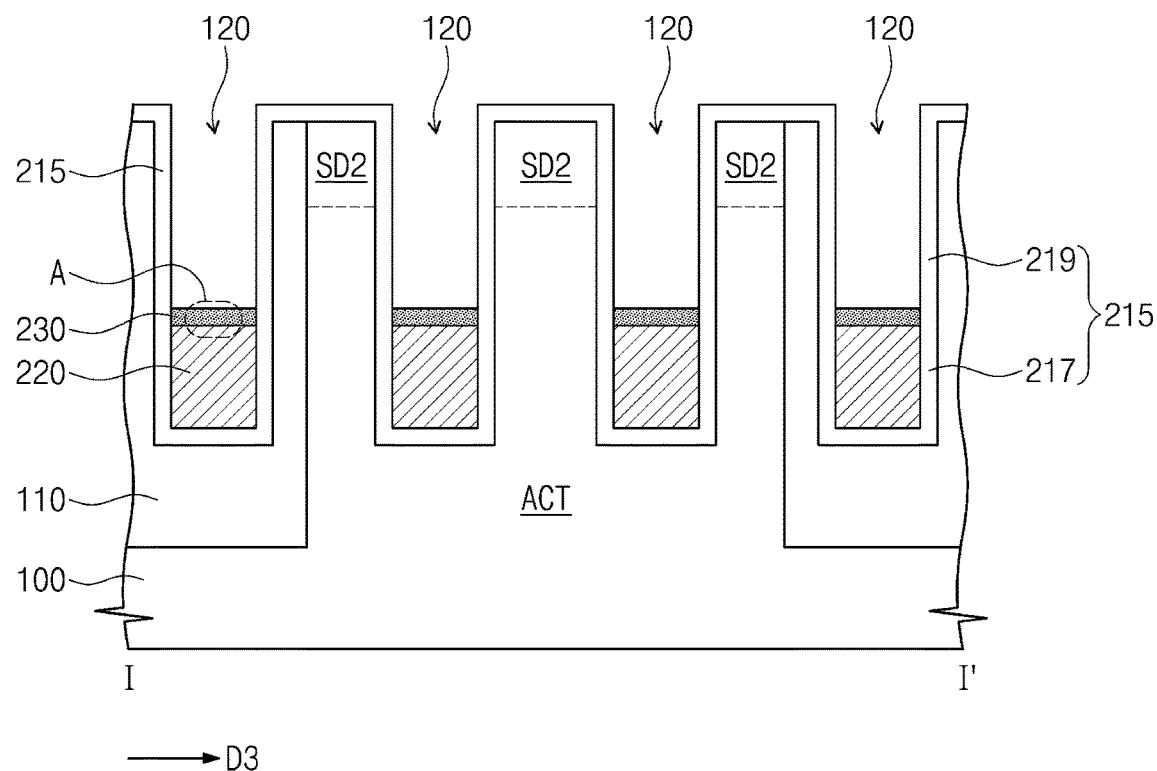
Figure 12B:
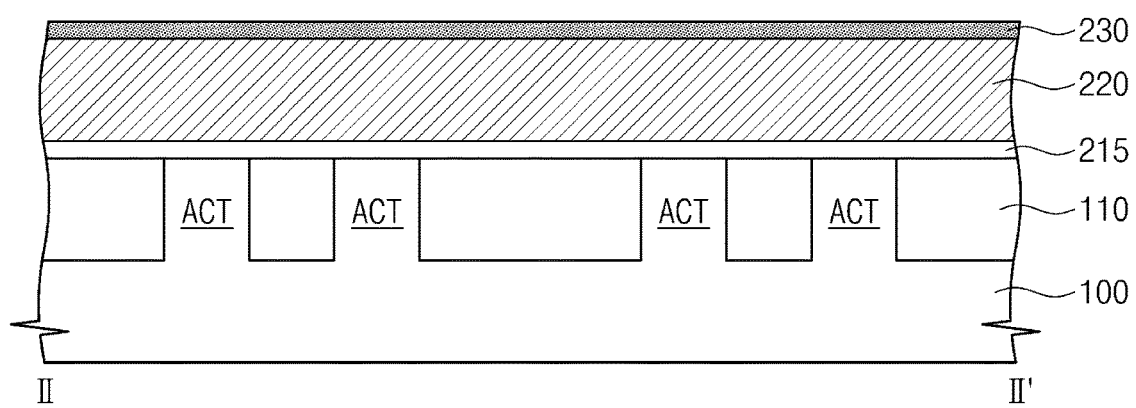

According to some embodiments, referring to FIGS. 1, 12A, and 12B, the barrier layer 230 is formed on the first gate electrode 220. In detail, a surface treatment process is performed on the preliminary barrier layer 235. The surface treatment process is a nitrification process. As a result of the surface treatment process, the preliminary barrier layer 235 is nitrified to form the barrier layer 230. An upper portion of the first gate electrode 220 is partially nitrified during the surface treatment process. Here, the nitrified upper portion of the first gate electrode 220 constitutes a portion of the barrier layer 230.

Figure 12C:
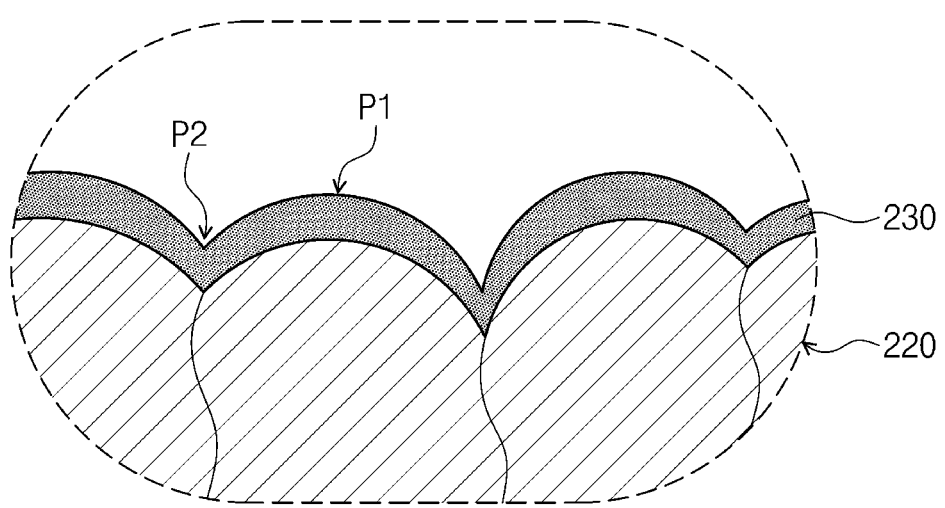

According to some embodiments, referring to FIG. 12C, the barrier layer 230 is formed to have a uniform thickness. For example, the nitrification of the preliminary barrier layer 235 is easily performed on both of the protruding and indented portions P1 and P2. As an example, nitrogen atoms easily infiltrate into a grain boundary of the first gate electrode 220. Here, the preliminary barrier layer 235 on the indented portion P2 is more effectively nitrified, because it is thinner than that on the protruding portion P1. Accordingly, during nitrification of the preliminary barrier layer 235 on the protruding portion P1, an upper portion of the first gate electrode 220 is partially nitrified, and in this case, the barrier layer 230 is composed of the nitrified portions of the preliminary barrier layer 235 and the first gate electrode 220. In other words, the barrier layer 230 on the indented portion P2 is thickened, and in this case, the barrier layer 230 has a uniform thickness on the protruding portion P1 and the indented portion P2.

In some embodiments, the surface treatment process is performed on a portion of the insulating layer 215. For example, an exposed fourth portion 219 of the insulating layer 215 that is positioned above the first gate electrode 220 and the barrier layer 230 is nitrified during the surface treatment process. Accordingly, the fourth portion 219 has a N+ ion concentration that is higher than that of a third portion 217 adjacent to the first gate electrode 220.

Figure 13A:
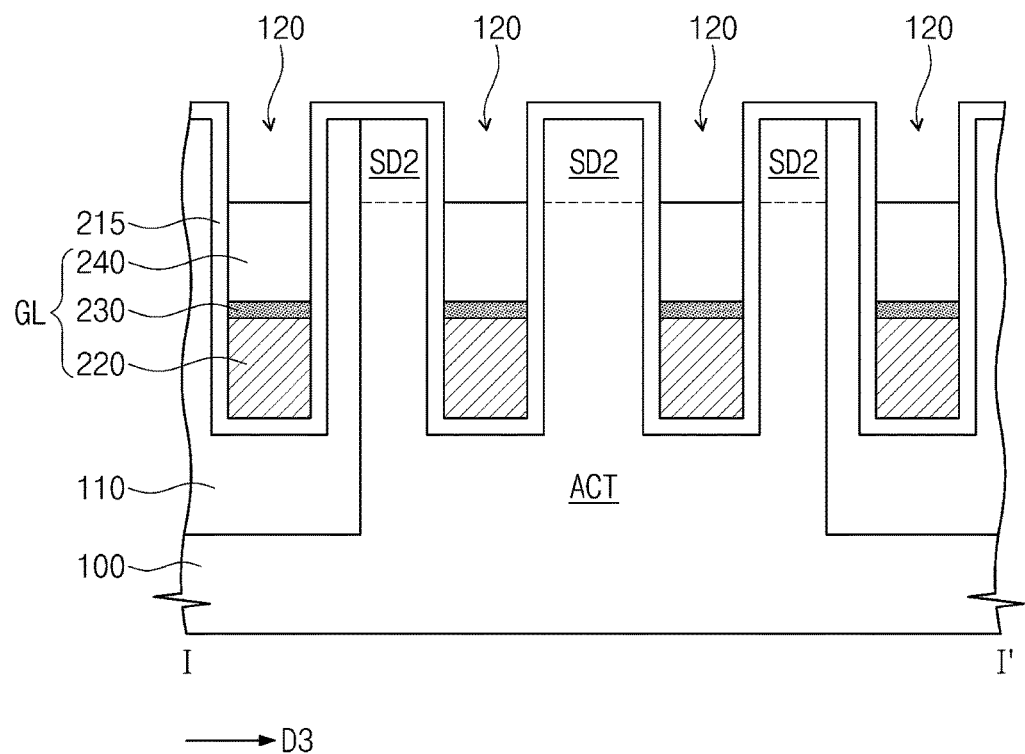
Figure 13B:
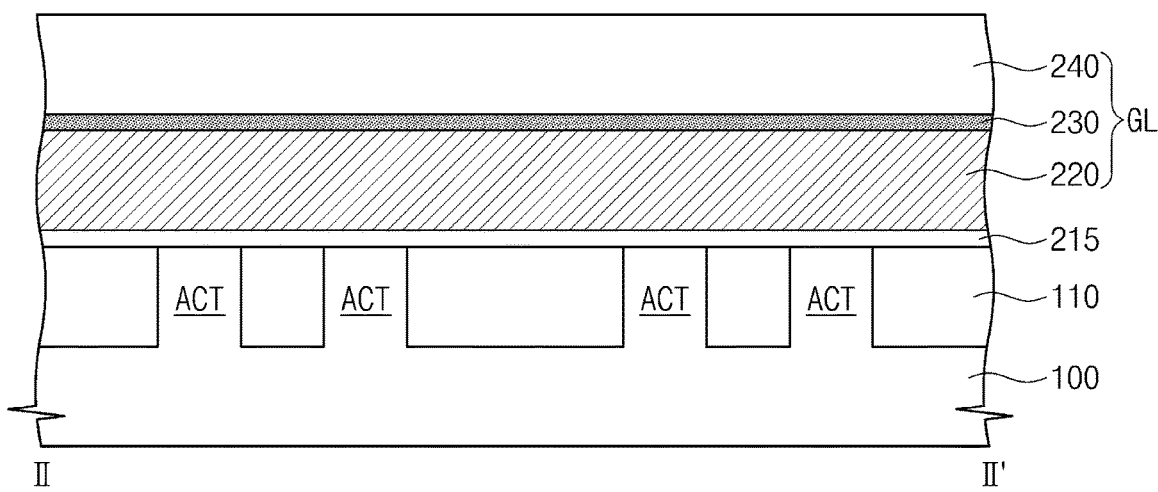

According to some embodiments, referring to FIGS. 1, 13A, and 13B, the second gate electrode 240 is formed on the barrier layer 230. For example, a poly-silicon layer is deposited on the substrate 100 and the insulating layer 215. The poly-silicon layer is formed to fill the trenches 120. The poly-silicon layer may be formed by, for example, a CVD process. Thereafter, the deposited poly-silicon layer is etched and doped with n- or p-type impurities to form the second gate electrode 240. The amount of impurities doped in the poly silicon layer can be adjusted in consideration of a work function required for the second gate electrode 240. The etching process is performed until the second gate electrode 240 has a desired thickness. In certain embodiments, the deposited poly silicon layer is doped with n- or p-type impurities, and then, the poly silicon layer is etched-back to form the second gate electrode 240.

According to some embodiments of the inventive concept, it is possible to form the barrier layer 230 having a uniform thickness. In the case where the barrier layer 230 has a non-uniform thickness, n- or p-type impurities can diffuse into the first gate electrode 220 through a thin portion of the barrier layer 230. By contrast, in some embodiments, during a process of forming the second gate electrode 240, n- or p-type impurities do not diffuse into the first gate electrode 220. Thus, it is possible to dope the second gate electrode 240 with a large amount of n- or p-type impurities, to adjust the work function, without deteriorating or damaging the first gate electrode 220. In other words, according to some embodiments of the inventive concept, it is possible to adjust the work function of the gate lines GL within a relatively large range. This allows the gate lines GL to have a desired work function that can meet technical requirements for a semiconductor memory device.

Figure 13C:
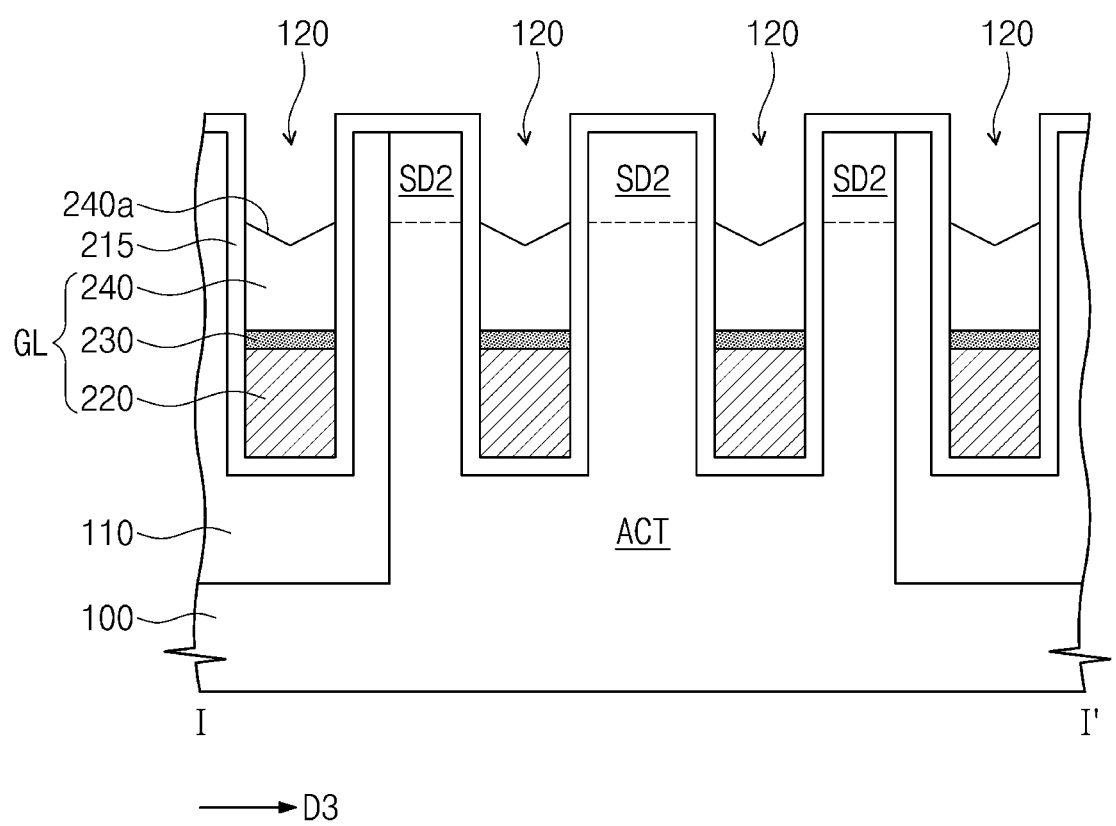
FIG. 13C is a sectional view illustrating a process of forming a second gate electrode.

In the case where the second gate electrode 240 that includes poly silicon is doped with a large amount of impurities, the second gate electrode 240 has a reduced strength. In this case, the top surface 240a of the second gate electrode 240 is recessed, as shown in FIG. 13C, or a center region of the top surface 240a of the second gate electrode 240 is over-etched during a subsequent etch-back process to be performed after the doping process. As a result, the second gate electrode 240 is formed to have a top surface whose section is shaped like a letter "V" or "U". Hereinafter, embodiments of the inventive concept will be described in more detail with reference to the second gate electrode 240 of FIG. 13A.

As a result of the afore-described process, the gate lines GL are formed in the trenches 120. Each gate line GL includes the first gate electrode 220, the barrier layer 230, and the second gate electrode 240.

Figure 14A:
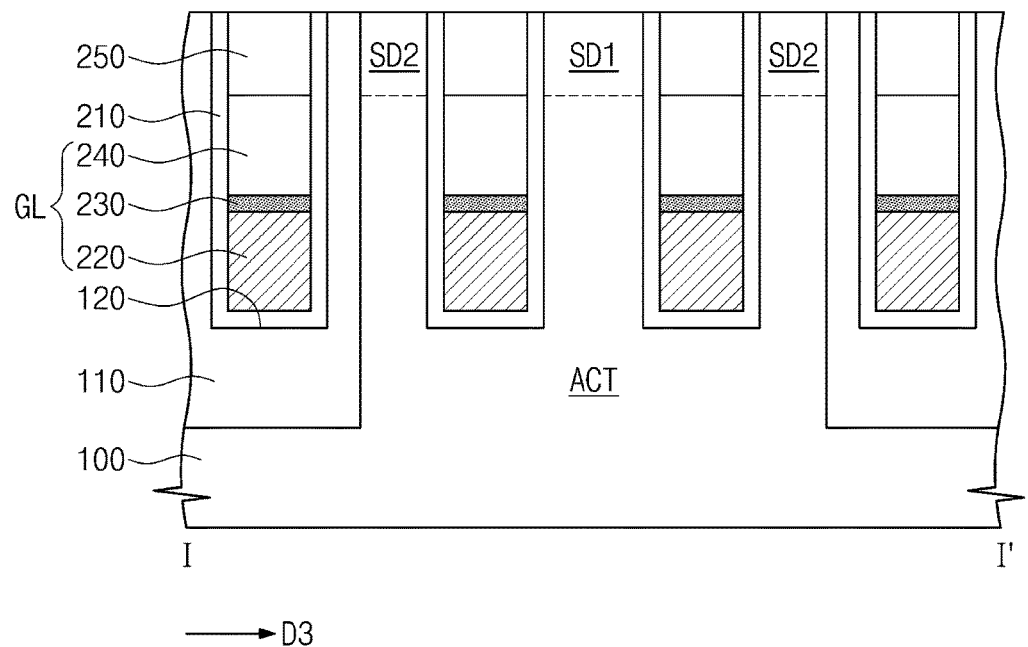
Figure 14B:
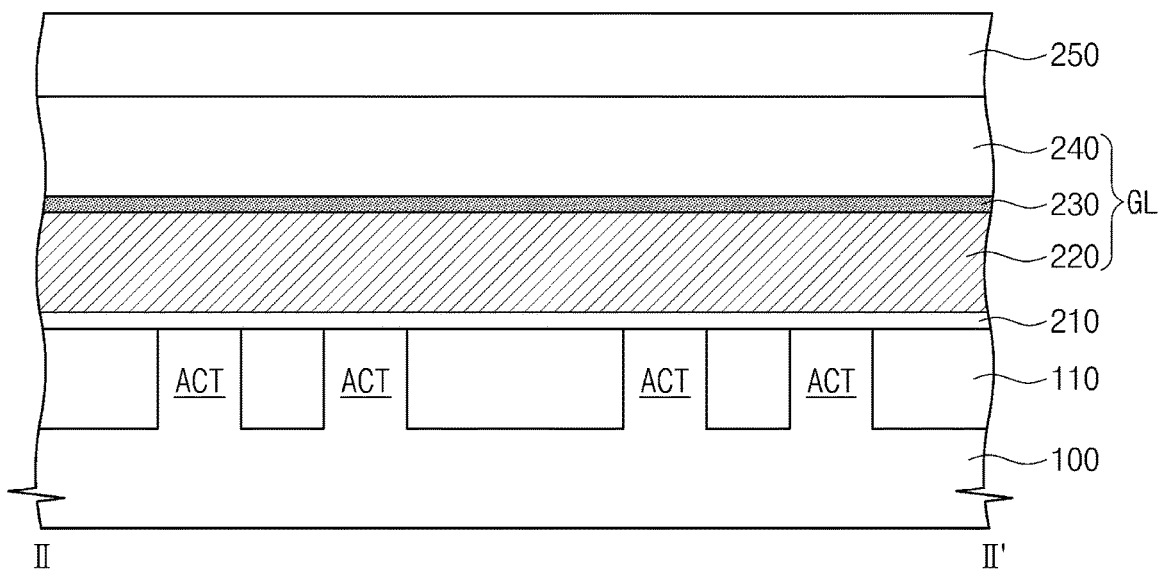

According to some embodiments, referring to FIGS. 1, 14A, and 14B, the first capping layers 250 are formed in the trenches 120. For example, forming the first capping layers 250 includes forming a capping layer on the substrate 100 and performing a planarization process on the capping layer. During the formation of the first capping layers 250, at least a portion of the insulating layer 215 is removed from the top surface of the substrate 100. As a result, the gate insulating layer 210 is formed between the gate lines GL and the active regions ACT or between the gate lines GL and the device isolation layer 110. In the case where, as shown in FIG. 13C, the top surface of the second gate electrode 240 of the gate line GL has a "V"- or "U"-shaped section, a bottom portion of the first capping layer 250 has a shape corresponding to the top surface of the second gate electrode 240. The first capping layers 250 are formed of or include at least one of silicon nitride, silicon oxide, or silicon oxynitride. As a result of the etching process, top surfaces of the device isolation layer 110 and the active regions ACT are exposed.

According to some embodiments, an ion implantation process is performed on the substrate 100 to form the first doped region SD1 in a region of the substrate 100 between two adjacent gate lines GL. The first doped region SD1 has the same conductivity type, such as n-type, as that of the second doped region SD2. The first doped region SD1 is formed to be deeper than the second doped region SD2.

In certain embodiments, the liner layer 260 is formed before forming the second gate electrode 240. The liner layer 260 may be formed by, for example, a CVD process. The liner layer 260 is formed to conformally cover the insulating layer 215. The liner layer 260 is formed of or includes at least one metallic material or metal nitride material. For example, the liner layer 260 includes at least one of titanium (Ti), tungsten (W), or nitrides thereof. If the liner layer 260 is formed, a semiconductor memory device fabricated by a subsequent process has the same structure as that shown in FIG. 5. Hereinafter, embodiments of the inventive concept will be described with reference to an example in which no liner layer 260 is formed.

According to some embodiments, referring back to FIGS. 1, 2A, and 2B, a conductive layer is formed on the substrate 100 and is patterned to form the first pad 310 and the second pad 320. The first pad 310 is connected to the first doped region SD1, and the second pad 320 is connected to the second doped region SD2. The first pad 310 and the second pad 320 are formed of or include at least one of a doped poly-crystalline silicon layer, a doped single-crystalline silicon layer, or a metal layer.

According to some embodiments, the first interlayer insulating layer 400 is formed on the first and second pads 310 and 320. The first interlayer insulating layer 400 may be formed by, for example, a CVD process. A portion of the first interlayer insulating layer 400 is patterned to form contact holes. A conductive material is formed on the first interlayer insulating layer 400 to fill the contact holes, and then, a capping layer is formed on the conductive material. The capping layer and the conductive material are patterned to form first contacts 510 in the contact holes, the bit lines BL, and the second capping layers 520 on the bit lines BL. An insulating spacer layer is conformally deposited on the first interlayer insulating layer 400 and is anisotropically etched to form insulating spacers 530 that cover side surfaces of the bit lines BL.

According to some embodiments, the second interlayer insulating layer 540 is formed on the first interlayer insulating layer 400, and then, a planarization process is performed to expose top surfaces of the second capping layers 520. Thereafter, the second contact 610 are formed that penetrate the second interlayer insulating layer 540 and the first interlayer insulating layer 400 to be connected to the second pad 320. The supporting layer 700 is formed on the second interlayer insulating layer 540. The supporting layer 700 may be formed by, for example, a CVD process. The first electrodes 620 are formed that penetrate the supporting layer 700, and each of the first electrodes 620 is connected to the second contact 610. The dielectric layer 630, which conformally covers the first electrodes 620, and the second electrode 640, which covers the first electrodes 620, are formed that constitute the capacitor CA. A semiconductor memory device according to some embodiments of the inventive concept can be fabricated by the afore-described method.

According to some embodiments, if the barrier layer 230 does not have a uniform thickness, silicon or n-type impurities can diffuse into the first gate electrode 220 through a thin portion of the barrier layer 230, and electric resistance between the first and second gate electrodes 220 and 240 increases at a thick portion of the barrier layer 230. By contrast, in a method of fabricating a semiconductor memory device according to some embodiments of the inventive concept, the barrier layer 230 is formed to have a substantially uniform thickness. Thus, dispersion errors in a process of forming the barrier layer 230 can be reduced. Furthermore, not only can barrier characteristics of the barrier layer 230 be improved, but also electric characteristics between the first and second gate electrodes 220 and 240.

Figure 15A:
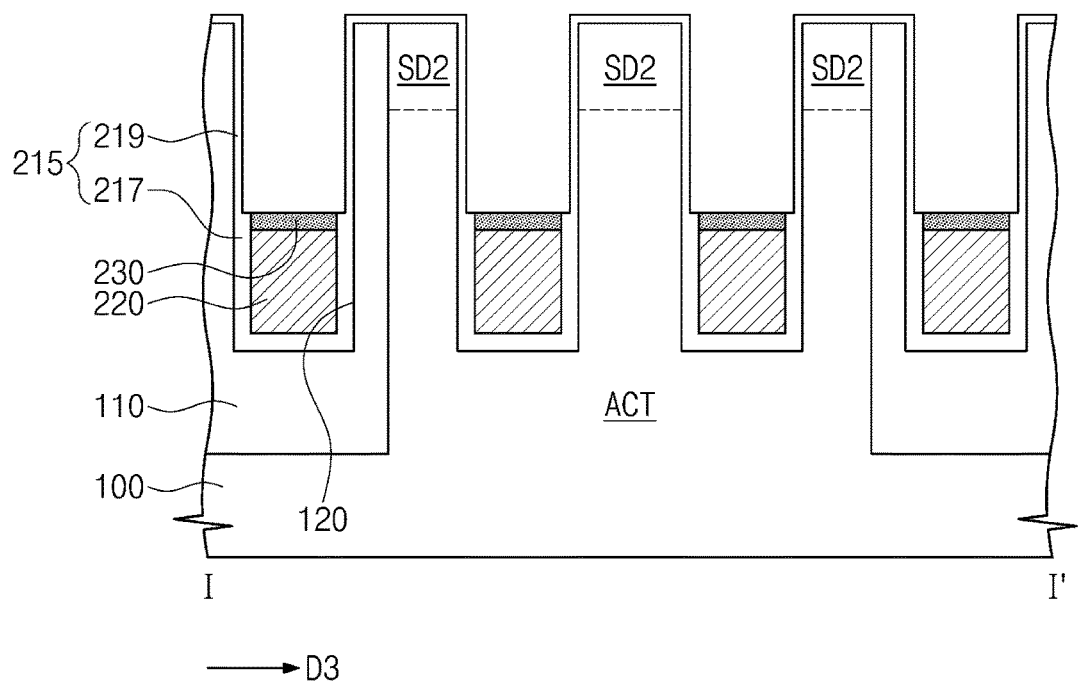
FIGS. 15A and 16A are sectional views that illustrate a method of fabricating a semiconductor memory device according to some embodiments of the inventive concept.
Figure 15B:
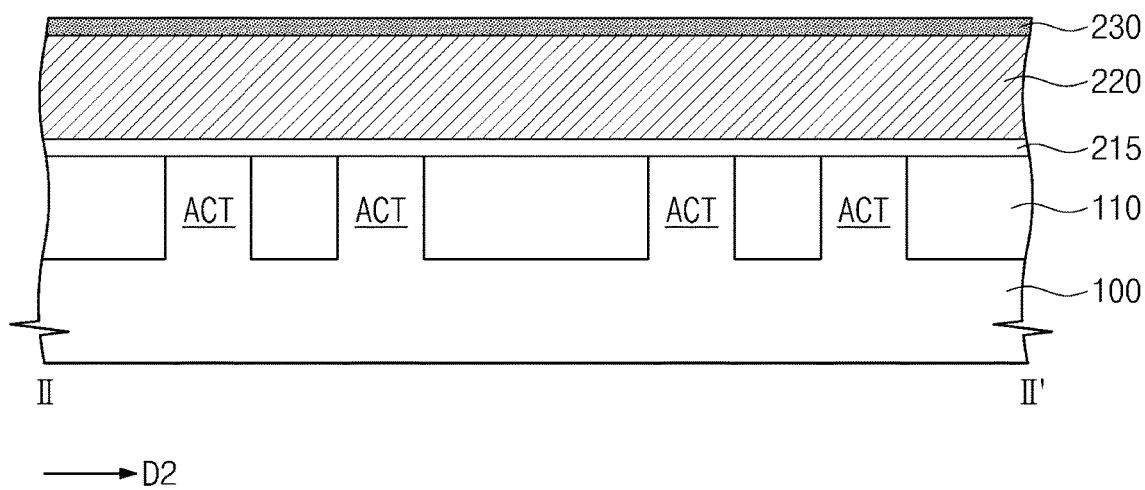
FIGS. 15B and 16B are sectional views that illustrate a method of fabricating a semiconductor memory device according to some embodiments of the inventive concept.
Figure 16A:
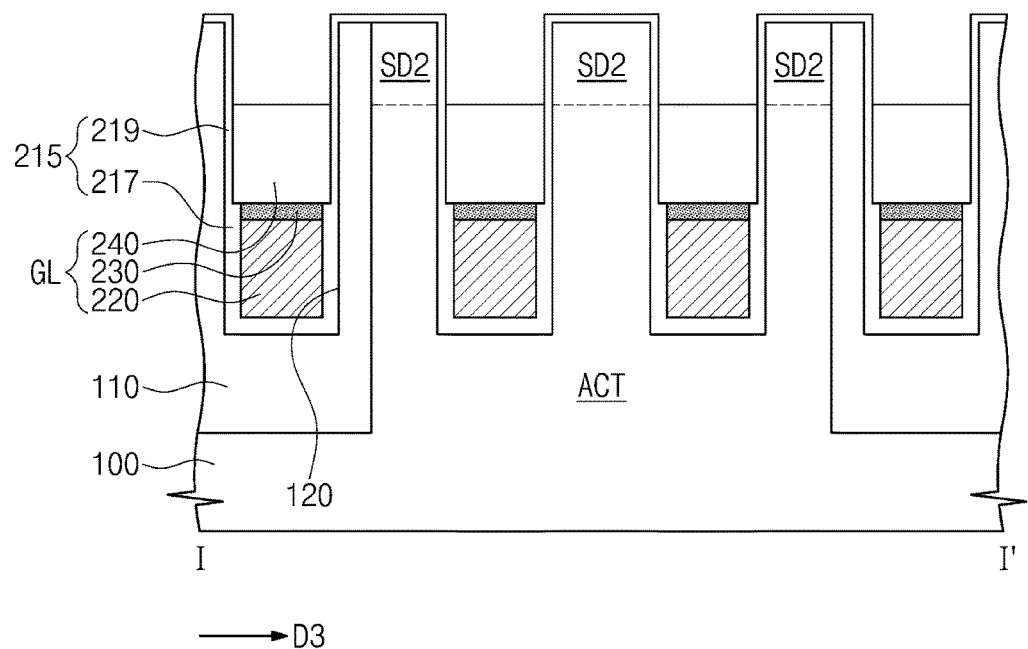
Figure 16B:
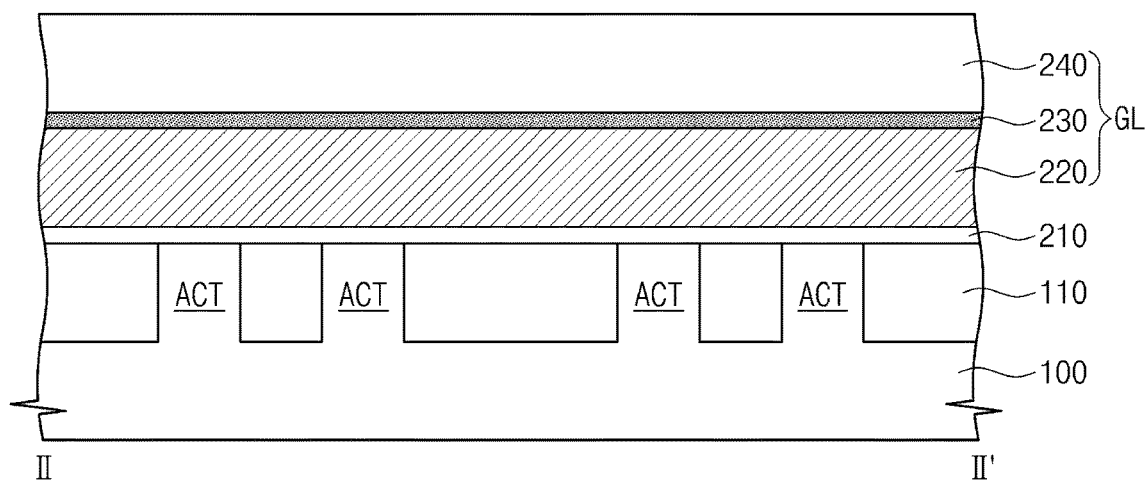

FIGS. 15A and 16A are sectional views taken along line I-I' of FIG. 1 that illustrate a method of fabricating a semiconductor memory device according to some embodiments of the inventive concept. FIGS. 15B and 16B are sectional views taken along line II-IF of FIG. 1 that illustrate a method of fabricating a semiconductor memory device according to some embodiments of the inventive concept.

According to some embodiments, referring to FIGS. 1, 15A, and 15B, the second gate electrode 240 is formed to be wider than the first gate electrode 220. For example, an etching process is performed on the structure of FIGS. 12A and 12B. As a result of the etching process, the insulating layer 215 is partially removed. For example, the etching process is performed on the fourth portion 219 of the insulating layer 215, which is located above the first gate electrode 220 and the barrier layer 230. Accordingly, when measured in a direction perpendicular to the side surface of the trench 120, the third portion 217 of the insulating layer 215 is thicker than the fourth portion 219 of the insulating layer 215. An upper width of the trench 120 measured at a level above the first gate electrode 220 is greater than a lower width of the trench 120 at a level of the first gate electrode 220.

According to some embodiments, referring to FIGS. 1, 16A, and 16B, the second gate electrode 240 is formed on the barrier layer 230. For example, forming the second gate electrode 240 includes depositing a poly-silicon layer on the barrier layer 230 and doping the poly-silicon layer with n-type impurities. The second gate electrode 240 in an upper region of the trench 120 is wider than the first gate electrode 220 in a lower region of the trench 120.

Thereafter, according to some embodiments, a process previously described with reference to FIGS. 14A, 14B, 2A, and 2B is performed on the structure of FIGS. 16A and 16B to form a semiconductor memory device of FIG. 7.

According to some embodiments of the inventive concept, a semiconductor memory device may be configured such that leakage current in a doped region, such as gate-induced-drain-leakage (GIDL) current, is suppressed.

In addition, according to some embodiments of the inventive concept, a barrier layer is provided to prevent silicon or n-type impurities in a second gate electrode from diffusing into a first gate electrode and thereby to prevent a metal silicide layer or a metal nitride layer from forming. Accordingly, electric characteristics of gate lines can be improved.

Furthermore, according to some embodiments of the inventive concept, leakage current into the gate insulating layer can be reduced, which can improve the reliability of a semiconductor memory device.

In a method of fabricating a semiconductor memory device according to some embodiments of the inventive concept, the barrier layer can be formed to have a substantially uniform thickness. Accordingly, dispersion errors in a process of forming the barrier layer can be reduced, which can improve not only barrier characteristics of the barrier layer but also electric characteristics between the first and second gate electrodes.

While exemplary embodiments of the inventive concepts have been particularly shown and described, it will be understood by one of ordinary skill in the art that variations in form and detail may be made therein without departing from the spirit and scope of the attached claims.

What is claimed is:
1. A semiconductor memory device, comprising:
a substrate that includes trenches;
a device isolation layer that defines a plurality of active regions of the substrate, wherein the active regions extend in a direction that crosses the trenches;
first doped regions disposed between the trenches at the active regions;
second doped regions disposed between the trenches and the device isolation, layer at the active regions;
gate lines that intersect the active regions and buried in the trenches;
bit lines disposed on the substrate and connected to the first doped regions; and
capacitors disposed on the substrate and connected to the second doped regions,
wherein each of gate lines comprises:
a first gate electrode disposed in a lower portion of the trench;
a second gate electrode disposed on the first gate electrode; and
a barrier layer disposed between the first gate electrode and the second gate electrode,
wherein the barrier layer includes an oxynitride of the metal comprised in the first gate electrode, and
wherein the first doped regions and the second doped regions have a conductivity type different from that of the active regions of the substrate.
2. The semiconductor memory device of claim 1, further comprising
a gate insulating layer disposed in the trench that covers bottom and inner side surfaces of the trench, and between the gate lines and the substrate,
wherein the gate insulating layer has a first portion adjacent to the first gate electrode and a second portion adjacent to the second gate electrode, and when measured in a direction perpendicular to a side surface of the trench, the first portion is thicker than the second portion.
3. The semiconductor memory device of claim 2, wherein the second gate electrode has a width that is greater than a width of the first gate electrode.
4. The semiconductor memory device of claim 3, wherein a nitrogen concentration of a portion of the gate insulating layer adjacent to the second gate electrode is greater than the nitrogen concentration of a portion of the gate insulating layer adjacent to the first gate electrode.
5. The semiconductor device of claim 1, further comprising a liner layer disposed between the second gate electrode and the substrate,
wherein the liner layer extends on a top surface of the first gate electrode.
6. The semiconductor memory device of claim 1, wherein a top surface of the second gate electrode has an inwardly recessed shape.
7. The semiconductor memory device of claim 1, wherein
the first gate electrode comprises a first metal,
the barrier layer comprises an oxynitride of the first metal, and
the second gate electrode comprises poly-silicon doped with impurities.
8. The semiconductor memory device of claim 1, further comprising
a capping layer disposed on the second gate electrode that fills a remaining region of the trench,
wherein a top surface of the capping layer is positioned at a same level as a top surface of the substrate.
9. The semiconductor device of claim 1,
wherein a lower region of the trenches have a "U"-shaped section, and
wherein the gate line filling the trench have a rounded lower portion.
10. The semiconductor device of claim 1, wherein a bottom end of the gate lines in the device isolation layer is located at a lower level than a bottom end of the gate lines on the active regions.
11. The semiconductor device of claim 1, wherein the second gate electrode has a work-function that is less than a work-function of the first gate electrode.
12. The semiconductor device of claim 1, wherein
the first gate electrode and the second gate electrode are spaced apart from each other by the barrier layer, and
the barrier layer has a uniform thickness.
13. The semiconductor device of claim 1, further comprising an interlayer insulating layer that covers the substrate,
wherein each of the capacitors comprises:
first electrode on the interlayer insulating layer;
a second electrode on the first electrode;
a dielectric layer between the first electrode and the second electrode; and
a supporting layer disposed on an outer sidewall of the first electrode.
14. A semiconductor device, comprising:
a substrate that includes active; regions surrounded by a device isolation layer, wherein the substrate includes trenches that intersect the active regions;
a gate insulating layer disposed in the trenches that covers bottom and inner side surfaces of the trenches;
a first gate electrode disposed in a lower portion of the trenches;
a barrier layer disposed in the trenches and on the first gate electrode;

a second gate electrode disposed in the trenches and on the barrier layer;

doped regions in the active regions, wherein the doped regions comprise first doped regions disposed between the trenches, and second doped regions disposed between the trenches and the device isolation layer;

an interlayer insulating layer disposed on the substrate and that covers the doped regions and the second gate electrode;

a bit line disposed in interlayer insulating layer, and connected to the first doped region; and capacitors disposed on the interlayer insulating layer, and connected to the second doped regions, wherein the second gate electrode has a width that is greater than a width of the first gate electrode and a width of the barrier layer, wherein the barrier layer comprises a metal oxynitride, and wherein the doped regions have a conductivity type different from that of the active regions of the substrate.

15. The semiconductor memory device of claim 14, wherein the first gate electrode comprises a first metal, the barrier layer comprises an oxynitride of the first metal, and the second gate electrode comprises poly-silicon doped with impurities.

16. The semiconductor memory device of claim 14, further comprising:

first contacts that penetrate the interlayer insulating layer to connect with the bit line and the first doped region; and, second contacts that penetrate the interlayer insulating layer to connect with the capacitors and the second doped regions.

17. The semiconductor memory device of claim 14, wherein the gate insulating layer has a first portion adjacent to the first gate electrode and a second portion adjacent to the second gate electrode, and when measured in a direction perpendicular to a side surface of the trenches, the first portion is thicker than the second portion.

18. The semiconductor device of claim 14, further comprising a liner layer disposed between the second gate electrode and the substrate, wherein the liner layer extends on a top surface of the first gate electrode.

19. The semiconductor memory device of claim 14, wherein a top surface of the second gate electrode has an inwardly recessed shape.

20. A semiconductor memory device, comprising:

a semiconductor substrate that includes trenches;

a device isolation layer that defines a active regions of the semiconductor substrate, wherein the active regions intersect the trenches;

doped regions disposed in the active regions wherein the doped regions comprise first doped regions disposed between the trenches, and second doped regions disposed between the trenches and the device isolation layer, the doped regions being formed below a top surface of the semiconductor substrate, and;

gate lines buried in the trenches, wherein the gate lines comprise a first gate electrode and a second gate electrode that are sequentially stacked;

a capping layer disposed on the gate lines, and that fills a remaining region of the trench;

bit lines disposed onto and connected to the first doped regions between the trenches; and capacitors disposed onto and connected to the second doped regions between the trenches and the device isolation layer, wherein a nitrogen concentration of an upper portion of the first gate electrode adjacent to the second gate electrode is greater than the nitrogen concentration of another portion of the first gate electrode, and wherein the second gate electrode has a work-function that is less than a work function of the another portion of the first gate electrode.

* * * * *